(12) United States Patent
Yang

(10) Patent No.: US 10,833,024 B2
(45) Date of Patent: Nov. 10, 2020

(54) SUBSTRATE STRUCTURE, PACKAGING METHOD AND SEMICONDUCTOR PACKAGE STRUCTURE

(71) Applicant: Advanced Semiconductor Engineering, Inc., Kaohsiung (TW)

(72) Inventor: Chang Yi Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/296,722

(22) Filed: Oct. 18, 2016

(65) Prior Publication Data

US 2018/0108619 A1    Apr. 19, 2018

(51) Int. Cl.
*H01L 23/498* (2006.01)
*H01L 21/56* (2006.01)
(Continued)

(52) U.S. Cl.
CPC .......... *H01L 23/562* (2013.01); *H01L 21/561* (2013.01); *H01L 21/565* (2013.01); *H01L 23/13* (2013.01); *H01L 23/3121* (2013.01); *H01L 23/49822* (2013.01); *H01L 23/544* (2013.01); *H01L 25/0652* (2013.01); *H01L 25/16* (2013.01); *H01L 25/50* (2013.01); *H01L 2223/54426* (2013.01); *H01L 2223/54486* (2013.01); *H01L 2224/16225* (2013.01); *H01L 2224/32225* (2013.01); *H01L 2224/73204* (2013.01); *H01L 2224/97* (2013.01); *H01L 2225/06517* (2013.01); *H01L 2225/06558* (2013.01); *H01L 2225/06572* (2013.01); *H01L 2225/06582* (2013.01); *H01L 2924/181* (2013.01); *H01L 2924/19105* (2013.01)

(58) Field of Classification Search
CPC .......................... H01L 23/562; H01L 21/4853
See application file for complete search history.

(56) References Cited

U.S. PATENT DOCUMENTS 5,275,546 A    1/1994 Fierkens
5,665,296 A    9/1997 Jain et al.
(Continued)

FOREIGN PATENT DOCUMENTS

CN         1531041 A       9/2004
JP      2015-076484 A      4/2015

OTHER PUBLICATIONS

Office Action for corresponding Taiwan Patent Application No. 107100124, dated Aug. 20, 2018, 6 pages.
(Continued)

*Primary Examiner* — Michelle Mandala
*Assistant Examiner* — Jordan M Klein
(74) *Attorney, Agent, or Firm* — Foley & Lardner LLP

(57) ABSTRACT

A substrate structure includes a substrate body, at least one first mold area and at least one second mold area. The substrate body has a first surface and a second surface opposite to the first surface, and defines at least one first through hole extending through the substrate body. The first mold area is disposed on the first surface of the substrate body. The second mold area is disposed on the second surface of the substrate body, wherein the first mold area is in communication with the second mold area through the first through hole.

20 Claims, 18 Drawing Sheets

(51) Int. Cl.
    *H01L 25/065*     (2006.01)
    *H01L 25/00*     (2006.01)
    *H01L 23/544*     (2006.01)
    *H01L 23/13*     (2006.01)
    *H01L 25/16*     (2006.01)
    *H01L 23/31*     (2006.01)
    *H01L 23/00*     (2006.01)

(56) References Cited

U.S. PATENT DOCUMENTS

| | | |
|---|---|---|
| 6,627,997 B1 | 9/2003 | Eguchi et al. |
| 9,101,050 B2 * | 8/2015 | Shimamura .......... H05K 1/0216 |
| 2002/0066947 A1 * | 6/2002 | Yu .......................... H01L 21/565 |
| | | 257/678 |
| 2004/0178514 A1 * | 9/2004 | Lee ........................ H01L 21/565 |
| | | 257/787 |
| 2011/0062584 A1 | 3/2011 | Ishihara |
| 2011/0101512 A1 | 5/2011 | Choi et al. |
| 2012/0139109 A1 * | 6/2012 | Choi ....................... H01L 21/56 |
| | | 257/738 |
| 2013/0161800 A1 * | 6/2013 | Byun ..................... H01L 23/18 |
| | | 257/667 |
| 2014/0085843 A1 * | 3/2014 | Otsubo .................. H01L 23/13 |
| | | 361/760 |
| 2015/0137339 A1 | 5/2015 | Oh et al. |
| 2017/0025319 A1 * | 1/2017 | Partington .............. H01L 23/42 |
| 2017/0077022 A1 | 3/2017 | Scanlan et al. |
| 2017/0103904 A1 * | 4/2017 | Nguyen ................ H01L 21/565 |

OTHER PUBLICATIONS

Search Report for corresponding Taiwan Patent Application No. 107100124, dated Aug. 20, 2018, 1 page.

Office Action for corresponding Chinese Patent Application No. 201611189680.1, dated Jul. 21, 2020, 11 pages.

Search Report (with English Translation) for corresponding Chinese Patent Application No. 201611189680.1, dated Jul. 21, 2020, 5 pages.

* cited by examiner

SUBSTRATE STRUCTURE, PACKAGING METHOD AND SEMICONDUCTOR PACKAGE STRUCTURE

BACKGROUND

1. Field of the Disclosure

The present disclosure relates to a substrate structure, a packaging method and a semiconductor package structure, and more particularly to a substrate structure capable of dual side molding, a semiconductor package structure including the same and a method for manufacturing the semiconductor package structure.

2. Description of the Related Art

In a package-on package ("POP") structure, two packages (e.g., a top package and a bottom package) are formed individually, and then are stacked (e.g., the top package is stacked on the bottom package). Since the two packages each includes a package substrate, namely, the top package includes a top package substrate and the bottom package includes a bottom package substrate, the total thickness of the POP structure is large, and cannot be reduced efficiently. Further, since the two packages (e.g., a top package and a bottom package) are formed individually and then stacked, the manufacturing process is complicated; thus, the units per hour ("UPH") that can be produced is low. In addition, the electrical interconnection between the two packages (e.g., a top package and a bottom package) is an issue, especially when the warpage of the package substrate occurs.

SUMMARY

In one aspect according to some embodiments, a substrate structure includes a substrate body, at least one first mold area and at least one second mold area. The substrate body has a first surface and a second surface opposite to the first surface, and defines at least one first through hole extending through the substrate body. The first mold area is disposed on the first surface of the substrate body. The second mold area is disposed on the second surface of the substrate body, wherein the first mold area is in communication with the second mold area through the first through hole.

In another aspect according to some embodiments, a packaging method includes: (a) providing a substrate structure, wherein the substrate structure includes a substrate body, at least one first mold area and at least one second mold area, the substrate body has a first surface and a second surface opposite to the first surface and defines at least one first through hole extending through the substrate body, the first mold area is disposed on the first surface of the substrate body, and the second mold area is disposed on the second surface of the substrate body; (b) providing a first mold chase and a second mold chase, wherein the substrate structure is sandwiched between the first mold chase and the second mold chase, the first mold chase defines at least one first cavity corresponding to the first mold area of the substrate structure, the second mold chase defines at least one second cavity corresponding to the second mold area of the substrate structure, wherein the first cavity is in communication with the second cavity through the first through hole; and (c) applying an encapsulant to the first cavity and the second cavity, wherein the encapsulant covers the first mold area and the second mold area, and the encapsulant flows through the first through hole.

In another aspect according to some embodiments, a semiconductor package structure includes a substrate body, at least one first chip, at least one first encapsulant, at least one second chip, at least one second encapsulant and at least one third encapsulant. The substrate body has a first surface and a second surface opposite to the first surface, and defines at least one first through hole extending through the substrate body. The first chip is disposed on the first surface of the substrate body. The first encapsulant is disposed on the first surface of the substrate body, and covers the first chip. The second chip is disposed on the second surface of the substrate body. The second encapsulant is disposed on the second surface of the substrate body, and covers the second chip. The third encapsulant is disposed in the first through hole, and connects the first encapsulant and the second encapsulant. The third encapsulant, the first encapsulant and the second encapsulant are formed integrally.

DETAILED DESCRIPTION

To address the issue of a POP structure, a dual side molding technique is performed on a substrate. In a double side molding, an upper molding compound and a lower molding compound may be formed on a printed circuit board ("PCB") substrate at different times. For example, the upper molding compound is formed on the top surface of the PCB substrate, and then after the upper molding compound is cured, the lower molding is formed on the bottom surface of the PCB substrate and then cured. Therefore, at least two thermal processes are conducted at two different times; thus, the manufacturing cost is high because of two molding processes at different times. Further, the UPH is still low, and the warpage control for the PCB substrate during the curing process of the molding compound remains an issue.

The present disclosure provides an improved substrate structure with a plurality of through holes, and improved techniques for packaging methods. The semiconductor substrate and techniques of the present disclosure are suitable for dual side molding wherein multiple moldings are cured at a same time. In particular, the through holes can be designed to be at specific positions. The opening of one end of the through hole can be within a first mold area on a first surface of the substrate structure, and the opening of the other end of the through hole can be within a second mold area on a second surface of the substrate structure. That is, the first mold area can be in communication (e.g., fluid communication) with the second mold area through the through hole. Thus, during the molding process, an encapsulant can be disposed on the first mold area, and can enter the second mold area through the through hole. Then, the encapsulant on the first mold area, in the through hole and on the second mold area can be cured at the same time. Therefore, a single thermal process can be conducted, and the substrate structure will be less likely to deform during the curing process of the molding compound.

Figure 1:
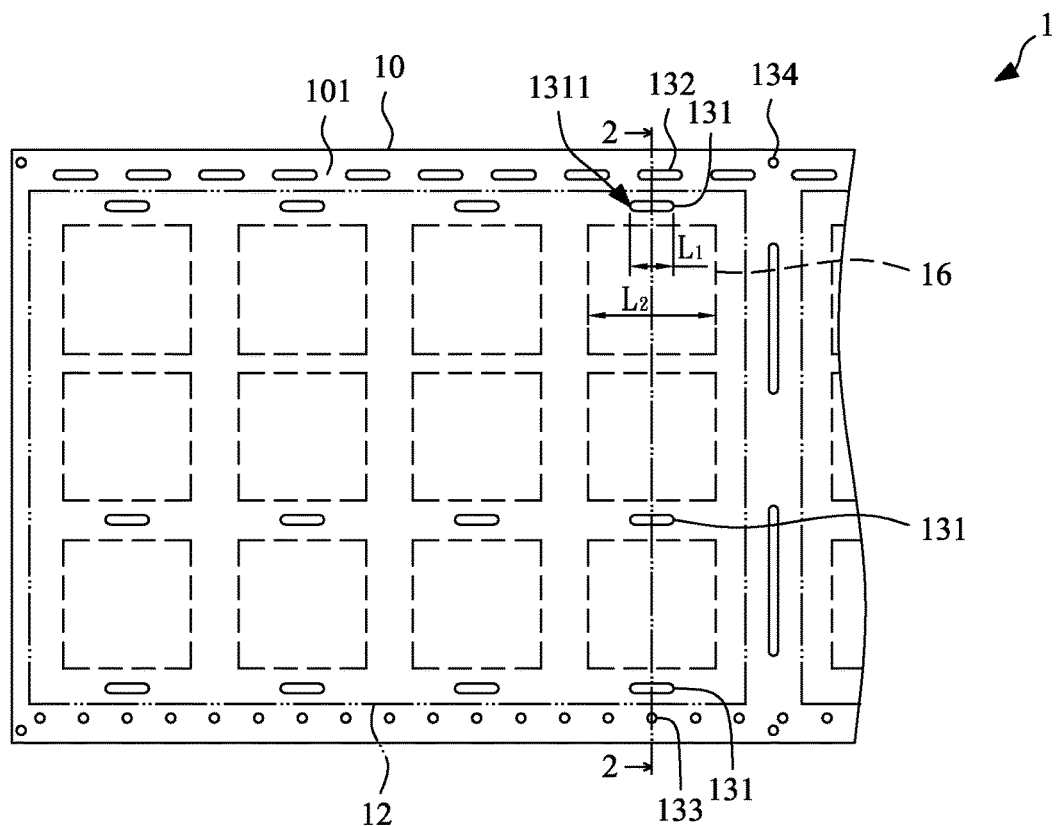
FIG. 1 illustrates a top view of a substrate structure according to one or more embodiments of the present disclosure.
Figure 2:
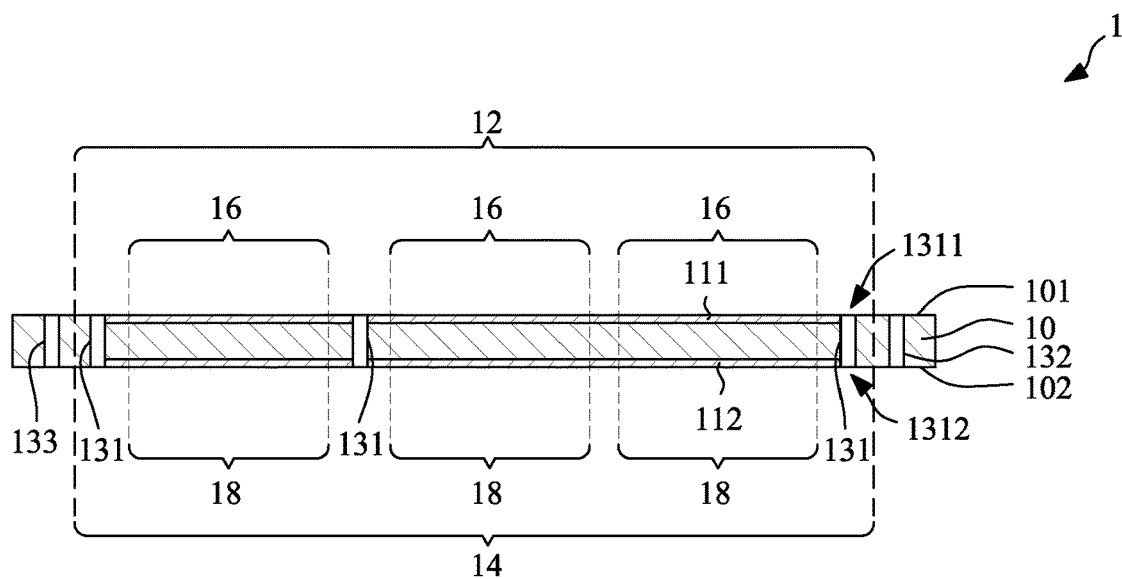
FIG. 2 illustrates a cross-sectional view taken along line 2-2 of the substrate structure of FIG. 1.

FIG. 1 illustrates a top view of a substrate structure 1 according to one or more embodiments of the present disclosure. FIG. 2 illustrates a cross-sectional view taken along line 2-2 of the substrate structure 1 of FIG. 1. The substrate structure 1 can be a package substrate, and can include a substrate body 10, a first circuit layer 111, a second circuit layer 112, at least one first mold area 12, at least one second mold area 14, at least one first chip bonding area 16 and at least one second chip bonding area 18. As shown in FIG. 1, the substrate structure 1 can be a strip type substrate structure. Alternatively, the substrate structure 1 may be a panel type substrate structure. It is noted that FIG. 1 shows a left portion of the substrate structure 1, which can be symmetric with respect to a right portion of the substrate structure 1.

The material of the substrate body 10 may include a glass-reinforced epoxy resin material (e.g., FR4), bismaleimide triazine ("BT"), epoxy, silicon, print circuit board ("PCB") material, glass or ceramic. The substrate body 10 has a first surface 101 and a second surface 102 opposite to the first surface 101, and defines at least one first through hole 131 extending through the substrate body 10. The first circuit layer 111 can be disposed adjacent to the first surface 101 of the substrate body 10. In one or more embodiments, the first circuit layer 111 can be disposed on the first surface 101 of the substrate body 10, or the first circuit layer 111 may be disposed in and exposed from the first surface 101 of the substrate body 10. The second circuit layer 112 can be disposed adjacent to the second surface 102 of the substrate body 10. In one or more embodiments, the second circuit layer 112 is disposed on the second surface 102 of the substrate body 10, or the second circuit layer 112 may be disposed in and exposed from the second surface 102 of the substrate body 10. The first circuit layer 111 can be electrically connected to the second circuit layer 112.

The first mold area 12 and the second mold area 14 are designated areas that can be covered by an encapsulant in the following molding process. The first mold area 12 can be disposed on the first surface 101 of the substrate body 10, and the second mold area 14 can be disposed on the second surface 102 of the substrate body 10. In the one or more embodiments illustrated in FIGS. 1 and 2, the size of the first mold area 12 can be substantially equal to the size of the second mold area 14, and the position of the first mold area 12 can substantially correspond to the position of the second mold area 14; for example, a boundary of the first mold area 12 can substantially overlap a boundary of the second mold area 14 from the top view of FIG. 1. However, in other embodiments, the size of the first mold area 12 may be different from the size of the second mold area 14, and/or the position of the first mold area 12 may not correspond to the position of the second mold area 14.

The first mold area 12 can be in communication (e.g., fluid communication) with the second mold area 14 through the first through hole 131. A first opening 1311 of one end of the first through hole 131 on the first surface 101 of the substrate body 10 can be within the first mold area 12 on the first surface 101 of the substrate structure 1, and a second opening 1312 of the other end of the first through hole 131 on the second surface 102 of the substrate structure 10 can be within the second mold area 14 on the second surface 102 of the substrate structure 1. Therefore, during the molding process, the encapsulant can cover the first mold area 12, and further can enter the second mold area 14 through the first through hole 131. In other words, the first through hole 131 can allow the encapsulant to flow through, and the first through hole 131 can form a portion of a flow path of the encapsulant.

As shown in FIG. 1, the substrate structure 1 can include three rows of first through holes 131 arranged along a direction of a long edge of the substrate structure 1. In one or more embodiments, the substrate structure 1 may include one row or two rows of first through holes 131, or more than three rows of first through holes 131.

The first chip bonding area 16 and the second chip bonding area 18 can be designated areas where semiconductor chips and/or other semiconductor elements (e.g., passive elements) are disposed. For example, one first chip bonding area 16 may include at least one semiconductor chip and/or at least one other semiconductor element (e.g., a passive element). One first chip bonding area 16 may correspond to one second chip bonding area 18, and both can be included in a single package unit after a singulation process.

The first chip bonding area 16 can be disposed on the first surface 101 of the substrate body 10, and the first chip bonding area 16 and the first through hole 131 can be located within the first mold area 12, and the first through hole 131 can be located outside the first chip bonding area 16. The second chip bonding area 18 can be disposed on the second surface 102 of the substrate body 10, and the second chip bonding area 18 and the first through hole 131 can be located within the second mold area 14, and the first through hole 131 can be located outside the second chip bonding area 18. In the one or more embodiments illustrated in FIGS. 1 and 2, the size of the first chip bonding area 16 is substantially equal to the size of the second chip bonding area 18, and the position of first chip bonding area 16 substantially corresponds to the position of the second chip bonding area 18. However, in other embodiments, the size of the first chip bonding area 16 may be different from the size of the second chip bonding area 18, and/or the position of the first chip bonding area 16 may not correspond to the position of the second chip bonding area 18.

In the one or more embodiments illustrated in FIGS. 1 and 2, one first mold area 12 includes a 4*3 array of first chip bonding areas 16, and one second mold area 14 includes a 4*3 array of second chip bonding areas 18. In addition, the first through hole 131 can be a slot type (e.g. can be longer along one dimension than along another orthogonal dimension), and the length L1 of the first through hole 131 can be in a range of about one third to about one half of the length L2 of the first chip bonding area 16.

In the one or more embodiments illustrated in FIGS. 1 and 2, the substrate structure 1 further defines at least one second through hole 132, at least one air venting through hole 133 and at least one position hole 134. As shown in FIG. 1, the substrate structure 1 can define a row of second through holes 132, a row of air venting through holes 133 and a row of position holes 134. The second through holes 132 can extend through the substrate body 10, and the second through holes 132 can be located outside the first mold area 12 and the second mold area 14. In some embodiments, the second through holes 132 are arranged along a direction parallel to a disposition of the first through holes 131. During the molding process, the encapsulant can enter the second through holes 132, and thereby balance an amount of the encapsulant on the first surface 101 of the substrate structure 10 and on the second surface 102 of the substrate structure 10.

The air venting through holes 133 can extend through the substrate body 10, and the air venting through holes 133 can be located outside the first mold area 12 and the second mold area 14. In some embodiments, the air venting through holes 133 are arranged along a direction parallel to the disposition of the first through holes 131, and are at positions opposite to the second through holes 132. During the molding process, the air venting through holes 133 can be aligned with air venting channels of a mold chase so as to vent the air in the cavity of the mold chase. The position holes 134 can extend through the substrate body 10, and the position holes 134 can be located outside the first mold area 12 and the second mold area 14. In some embodiments, the position holes 134 are arranged along a direction parallel to the disposition of the first through holes 131, and are at the positions nearest the edge of the substrate structure 1. When the mold chases clamp the substrate structure 1, a position pin of the mold chase will insert into the position holes 134 for positioning.

Figure 3:
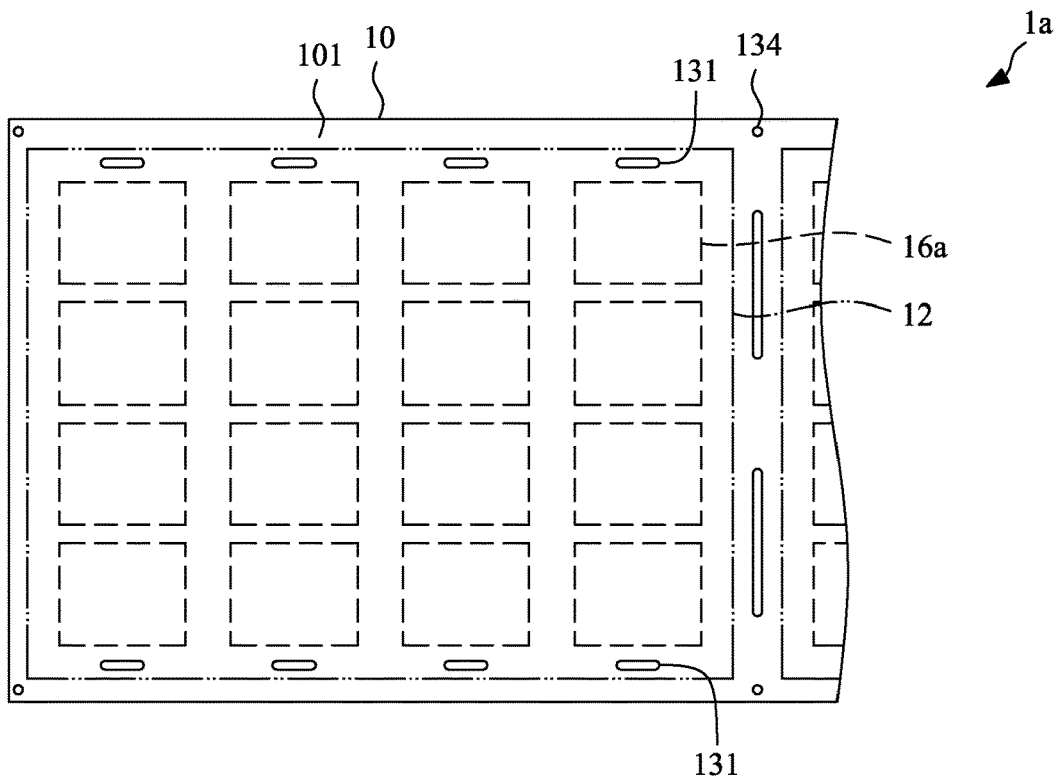
FIG. 3 illustrates a top view of a substrate structure according to one or more embodiments of the present disclosure.
Figure 4:
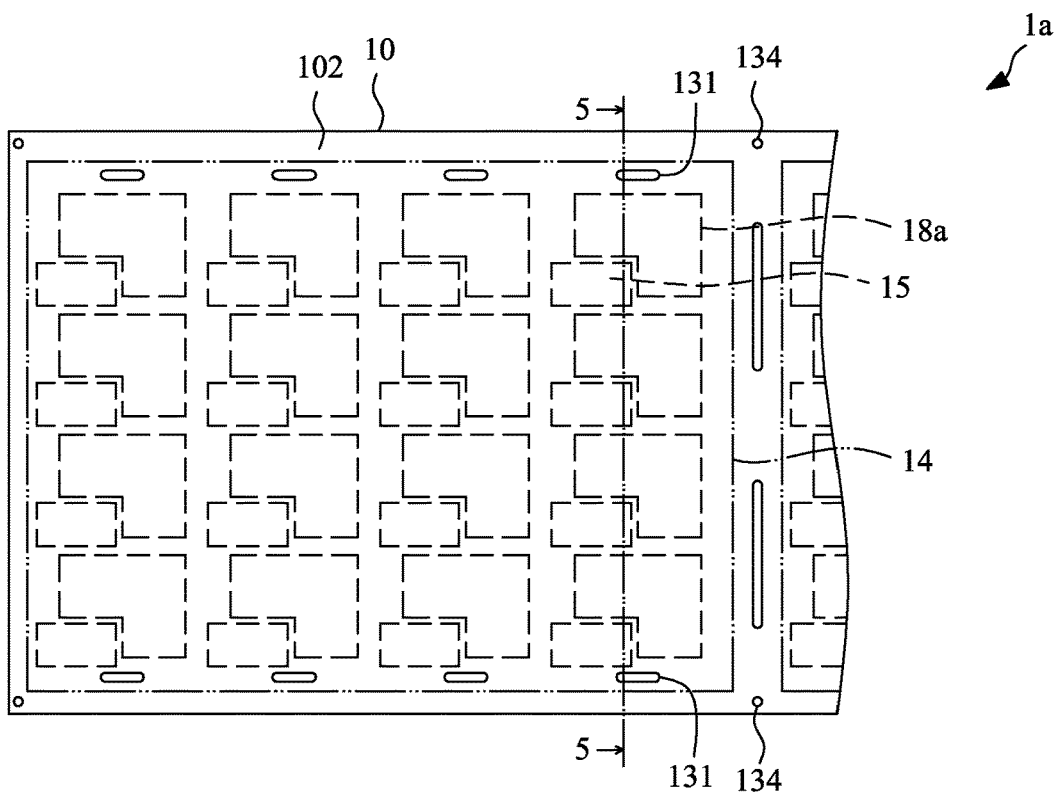
FIG. 4 illustrates a bottom view of the substrate structure of FIG. 3.
Figure 5:
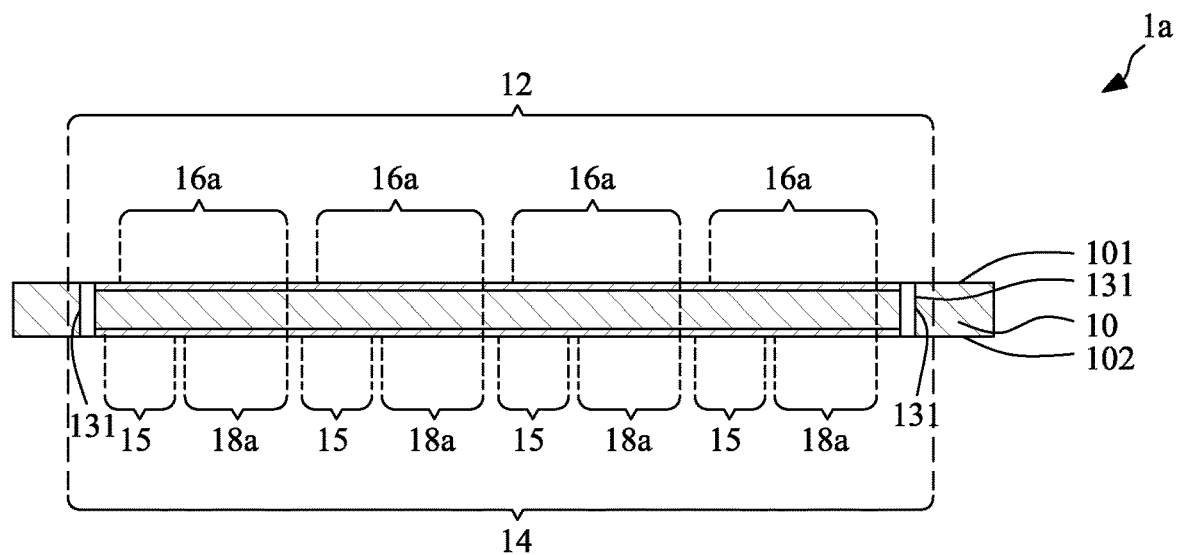
FIG. 5 illustrates a cross-sectional view taken along line 5-5 of FIG. 4.

FIG. 3 illustrates a top view of a substrate structure 1a according to one or more embodiments of the present disclosure. FIG. 4 illustrates a bottom view of the substrate structure 1a of FIG. 3. FIG. 5 illustrates a cross-sectional view taken along line 5-5 of FIG. 4. The substrate structure 1a can be similar to the substrate structure 1 as shown in FIGS. 1 and 2 in some respects, but the substrate structure 1a further includes a plurality of non-molding areas 15 in the second mold area 14. The non-molding areas 15 can be designated areas that the encapsulant will not cover in the following molding process. In addition, the size of a first chip bonding area 16a can be different from the size of a second chip bonding area 18a, and the position of the first chip bonding area 16a can correspond to the position of the second chip bonding area 18a; for example, the first chip bonding area 16a can at least partially overlap the second chip bonding area 18a from the top view or the bottom view. As shown in FIG. 4, each of the non-molding areas 15 can correspond to each of the second chip bonding areas 18a. It is understood that the substrate structure 1a may further define the second through holes 132, the air venting through holes 133 and the position holes 134 in a manner similar to that shown in FIGS. 1 and 2.

Figure 6:
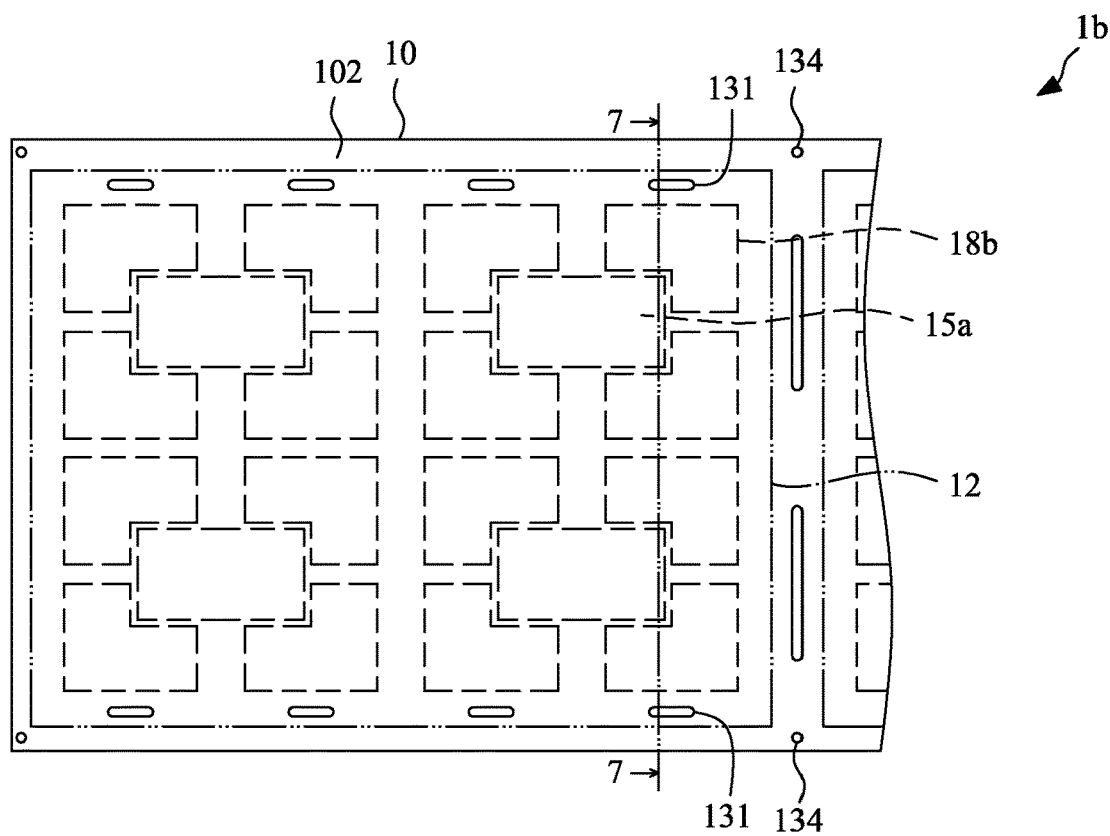
FIG. 6 illustrates a bottom view of a substrate structure according to one or more embodiments of the present disclosure.
Figure 7:
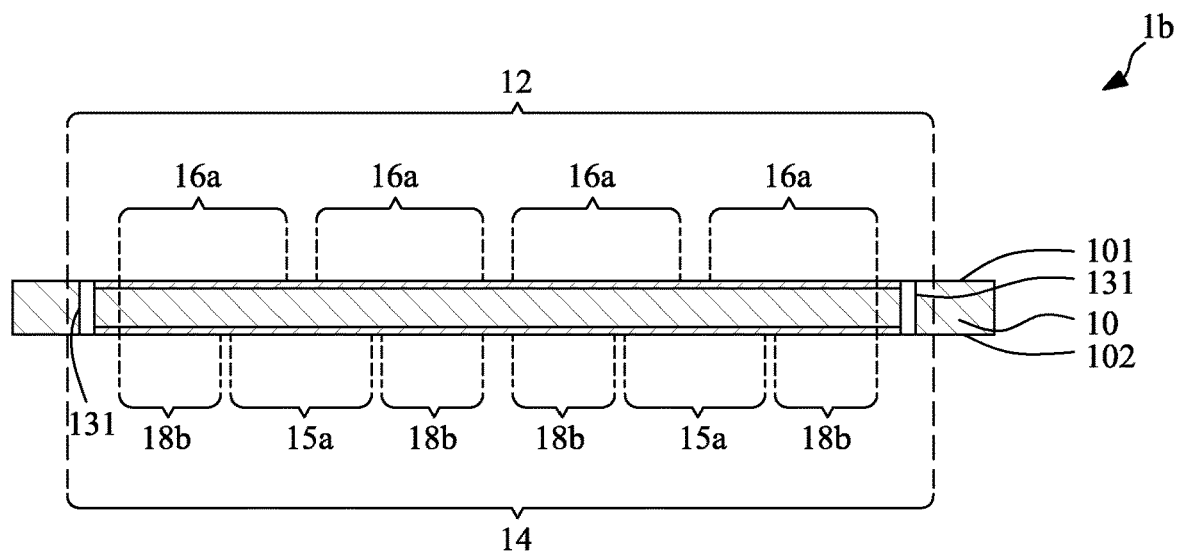
FIG. 7 illustrates a cross-sectional view taken along line 7-7 of FIG. 6.

FIG. 6 illustrates a bottom view of a substrate structure 1b according to one or more embodiments of the present disclosure. FIG. 7 illustrates a cross-sectional view taken along line 7-7 of FIG. 6. The substrate structure 1b can be similar to the substrate structure 1a as shown in FIGS. 3 to 5 in some respects, but differs at least in that the size and position of non-molding area 15a can differ from the non-molding areas 15 shown in FIGS. 3 to 5. It is noted that the top view of the substrate structure 1b is similar to the top view of the substrate structure 1a of FIG. 3. As shown in FIGS. 6 and 7, the size of the non-molding area 15a can be equal to a sum of the sizes of four non-molding areas 15 (FIG. 4), and one non-molding area 15a can be at least partially surrounded by four second chip bonding areas 18b. In addition, any two neighboring second chip bonding areas 18b can be in a relationship of mirror reflection to each other, as shown in FIG. 6. It is understood that the substrate structure 1b may further define the second through holes 132, the air venting through holes 133 and the position holes 134 as shown in FIGS. 1 and 2.

Figure 8:
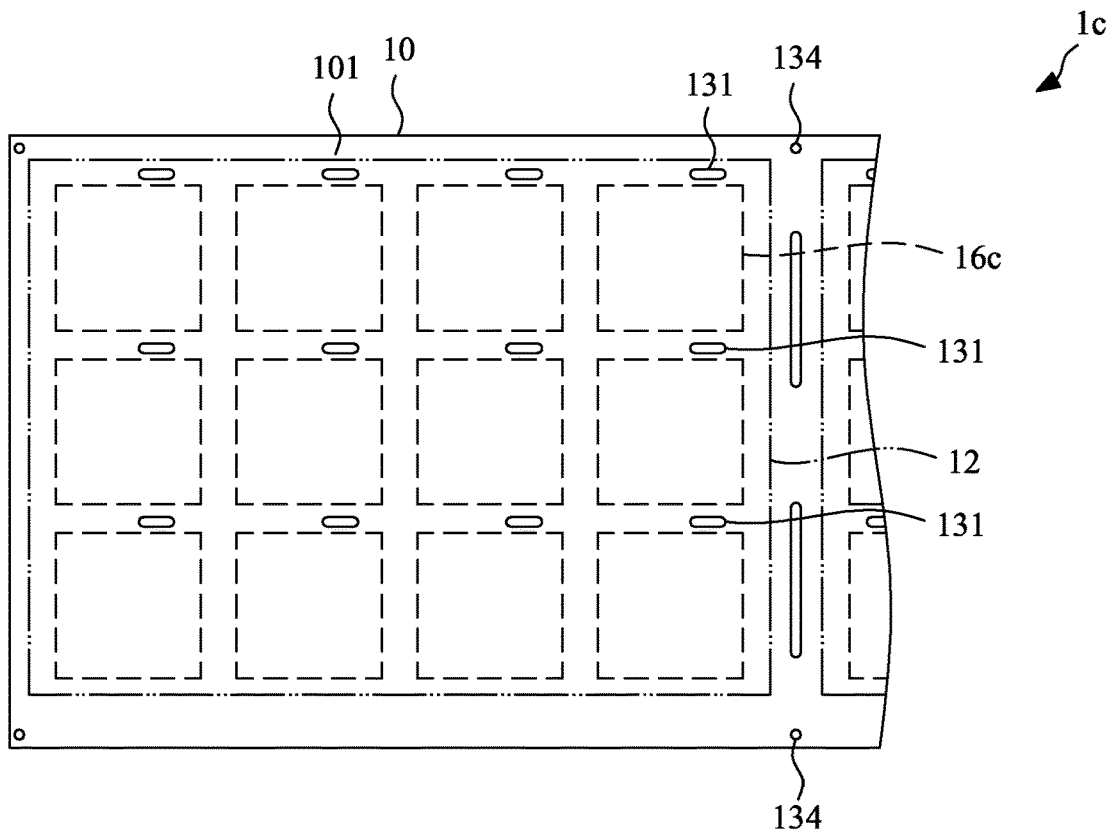
FIG. 8 illustrates a top view of a substrate structure according to one or more embodiments of the present disclosure.
Figure 9:
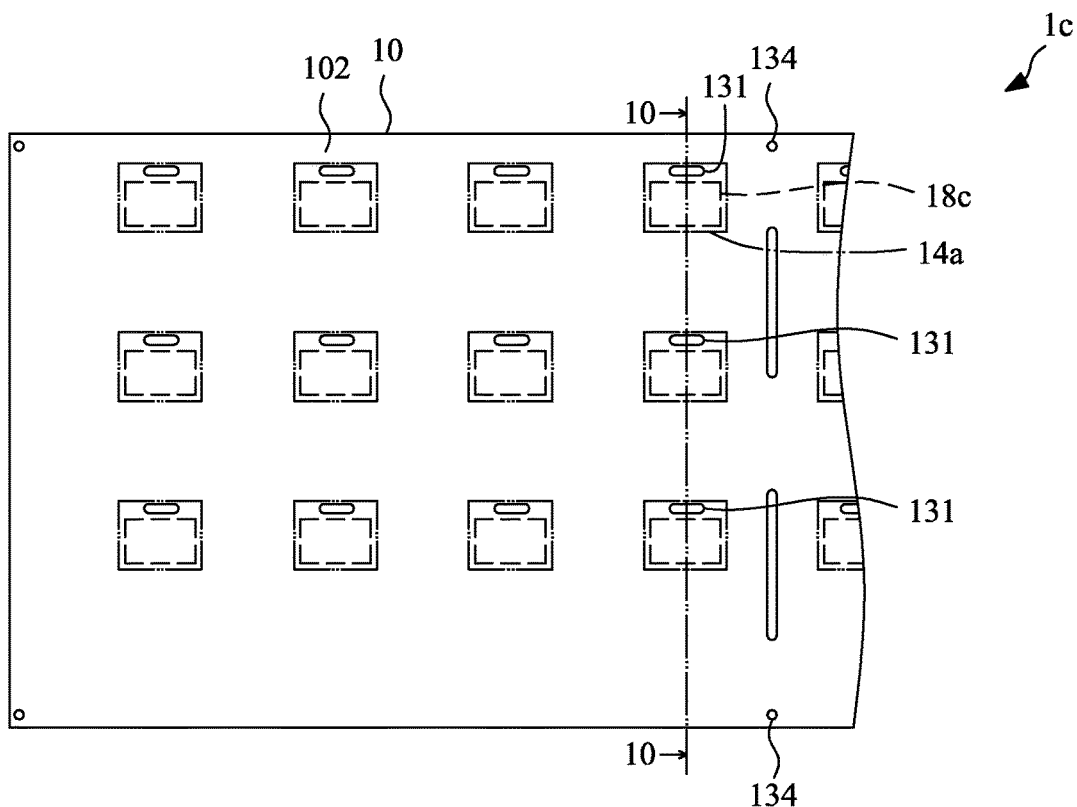
FIG. 9 illustrates a bottom view of the substrate structure of FIG. 8.
Figure 10:
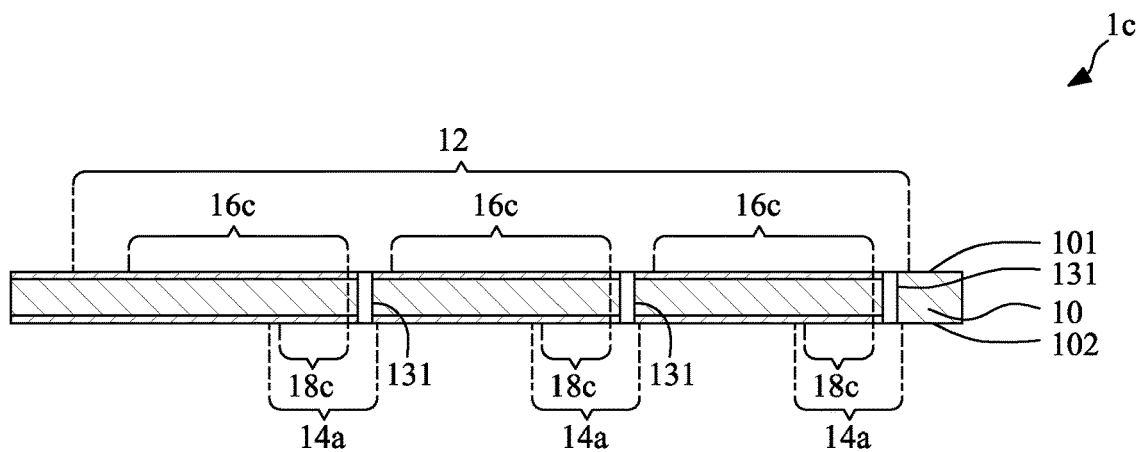
FIG. 10 illustrates a cross-sectional view taken along line 10-10 of FIG. 9.

FIG. 8 illustrates a top view of a substrate structure 1c according to one or more embodiments of the present disclosure. FIG. 9 illustrates a bottom view of the substrate structure 1c of FIG. 8. FIG. 10 illustrates a cross-sectional view taken along line 10-10 of FIG. 9. The substrate structure 1c can be similar to the substrate structure 1 as shown in FIGS. 1 and 2 in some respects, but can differ in at least the sizes and positions of second mold areas 14a. It is noted that the top view of the substrate structure 1c as shown in FIG. 8 can be substantially similar in some respects to the top view of the substrate structure 1 as shown in FIG. 1. As shown in FIG. 8, first chip bonding areas 16c and the first through holes 131 can be located within the first mold area 12, and at least one of the first through holes 131 can correspond to a respective one of the first chip bonding areas 16c. As shown in FIG. 9, second mold areas 14a can be separated from each other, and each of the first through holes 131 can be located within a corresponding second mold area 14a. That is, each of the second mold areas 14a can be an individual mold area, and two neighboring second mold areas 14a can be spaced apart by a gap. It is understood that the gap between the second mold areas 14a may be left uncovered by the encapsulant in the molding process.

Each of the second chip bonding areas 18c can be located within a corresponding one of the second mold areas 14a. As shown in FIG. 10, one first mold area 12 can correspond to a plurality of second mold areas 14a and to a plurality of first through holes 131, and all of the first through holes can be in communication with the first mold area 12. In one or more embodiments, a position of the first chip bonding area 16c corresponds to the position of the second chip bonding area 18c, and the size of the first chip bonding area 16c is greater than the size of the second chip bonding area 18c. It is understood that the substrate structure 1c may further define the second through holes 132, the air venting through holes 133 and the position holes 134 as shown in FIGS. 1 and 2.

Figure 11:
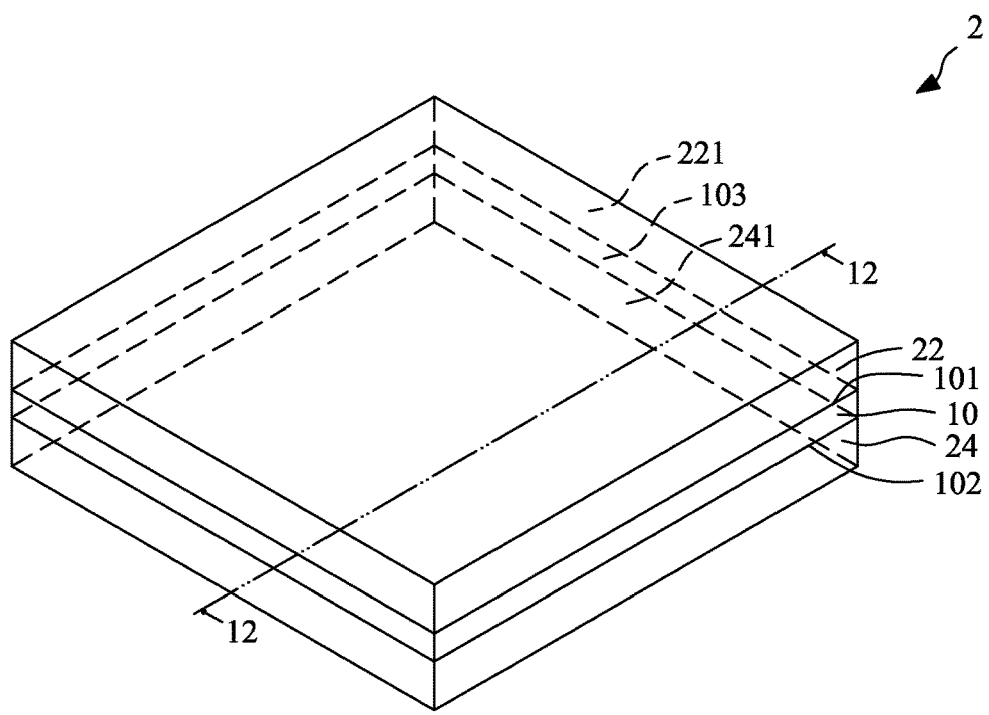
FIG. 11 illustrates a perspective view of a semiconductor package structure according to one or more embodiments of the present disclosure.
Figure 12:
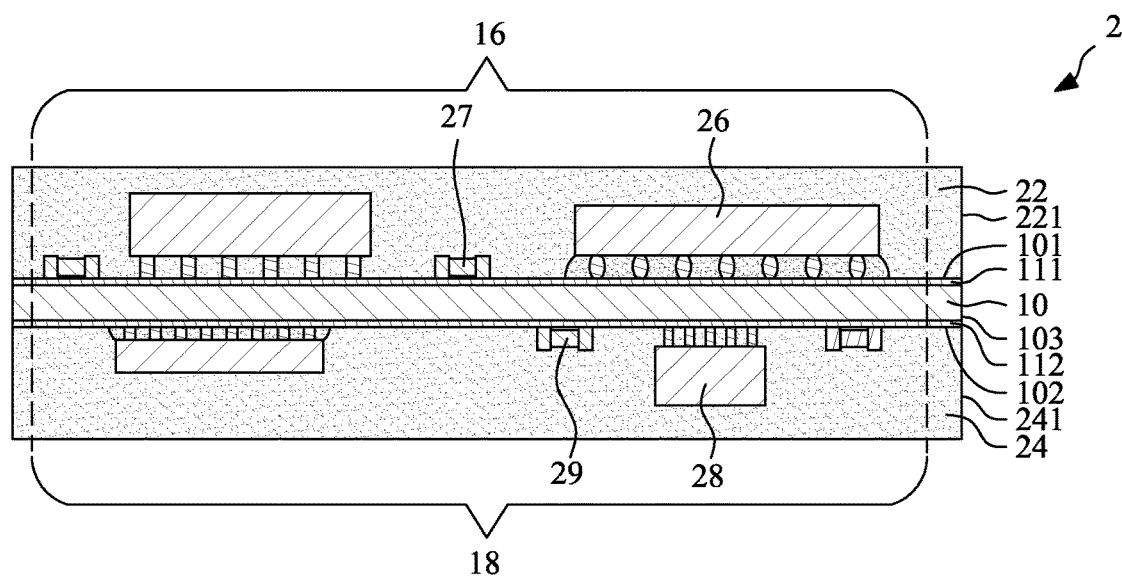
FIG. 12 illustrates a cross-sectional view taken along line 12-12 of FIG. 11.

FIG. 11 illustrates a perspective view of a semiconductor package structure 2 according to one or more embodiments of the present disclosure. FIG. 12 illustrates a cross-sectional view taken along line 12-12 of FIG. 11. The semiconductor package structure 2 can include a substrate body 10, at least one first chip 26, at least one first passive element 27, at least one first encapsulant 22, at least one second chip 28, at least one second passive element 29 and at least one second encapsulant 24. The substrate body 10 can be cut from the substrate body 10 of the substrate structure 1 of FIGS. 1 and 2, and can include a first surface 101, a second surface 102 opposite to the first surface 101, and four side surfaces 103. The first chip 26 and the first passive element 27 can be disposed on the first surface 101 of the substrate body 10 (e.g., within the first chip bonding area 16), and electrically connected to the first circuit layer 111. The first encapsulant 22 can be disposed on the first surface 101 of the substrate body 10, and can cover the first chip 26 and the first passive element 27. The first encapsulant 22 can have four side surfaces 221.

The second chip 28 and the second passive element 29 can be disposed on the second surface 102 of the substrate body 10 (e.g., within the second chip bonding area 18), and can be electrically connected to the second circuit layer 112. The second encapsulant 24 can be disposed on the second surface 102 of the substrate body 10, and can cover the second chip 28 and the second passive element 29. The second encapsulant 24 can have four side surfaces 241. A size of the first encapsulant 22 can be substantially equal to a size of the second encapsulant 24 so that the four side surfaces 103, 221, 241 of the substrate body 10, the first encapsulant 22 and the second encapsulant 24 are substantially coplanar. In one or more embodiments, the first encapsulant 22 and/or the second encapsulant 24 may further include at least one conductive through via (not shown) penetrating the first encapsulant 22 or the second encapsulant 24 which can form a path to electrically connect the substrate body 10 for external connection. In other embodiments, at least one conductive pillar or ball (not shown) covered by the first encapsulant 22 and/or the second encapsulant 24 can be disposed on the substrate body 10 and can be electrically connected to the substrate body 10 for external connection. As shown in FIGS. 11 and 12, the semiconductor package structure 2 is rectangular from a top view; however, in one or more embodiments, the semiconductor package structure 2 may be in an irregular shape from a top view, and the first chip bonding area 16 may be in an irregular shape.

Figure 13:
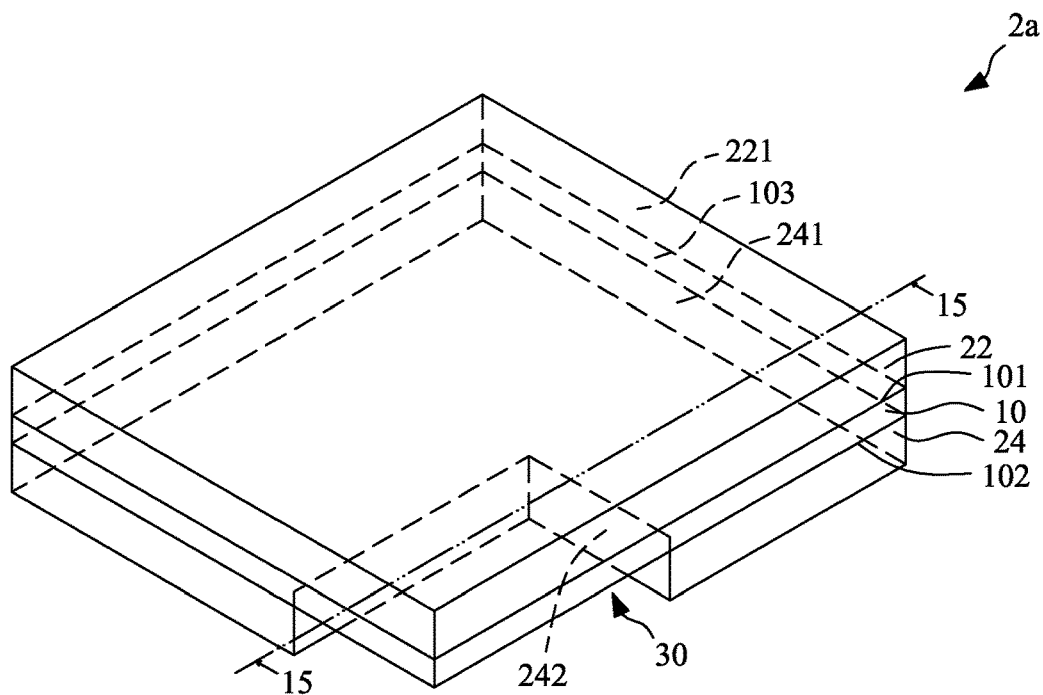
FIG. 13 illustrates a top perspective view of a semiconductor package structure according to one or more embodiments of the present disclosure.
Figure 14:
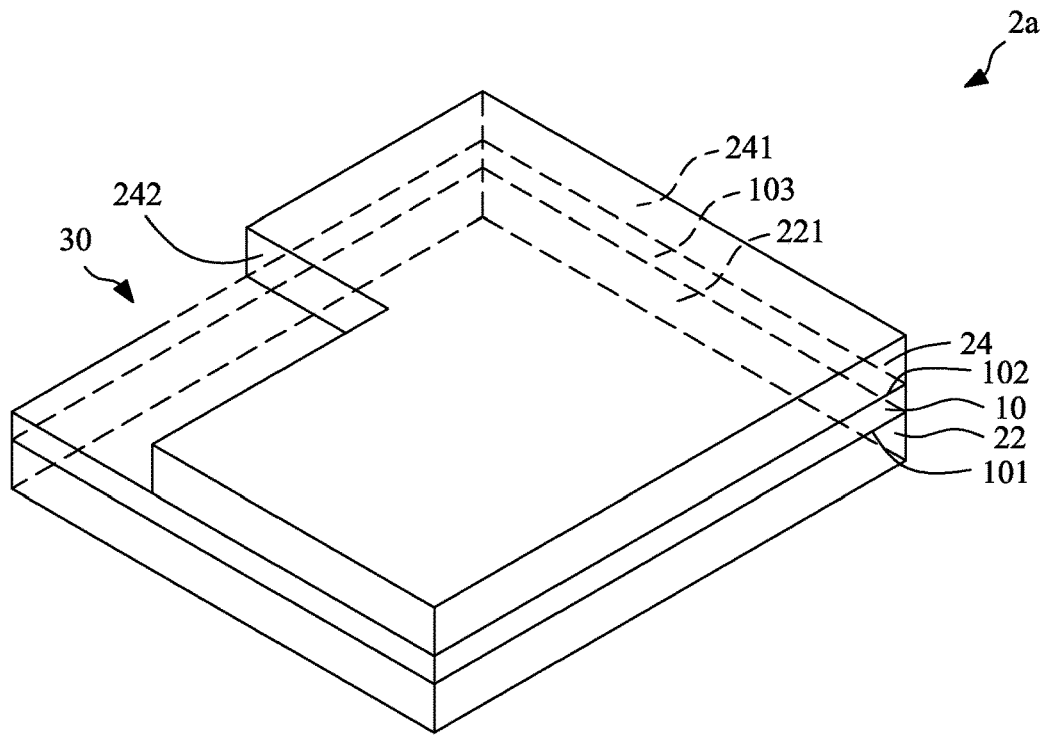
FIG. 14 illustrates a bottom perspective view of the semiconductor package structure of FIG. 13.
Figure 15:
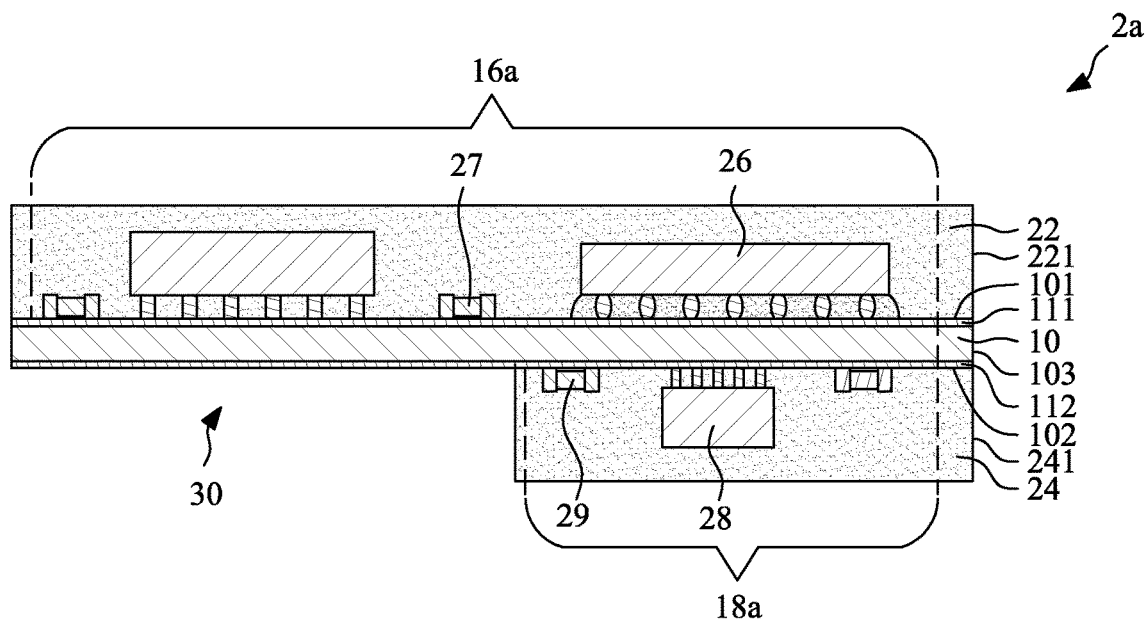
FIG. 15 illustrates a cross-sectional view taken along line 15-15 of FIG. 13.

FIG. 13 illustrates a top perspective view of a semiconductor package structure 2a according to one or more embodiments of the present disclosure. FIG. 14 illustrates a bottom perspective view of the semiconductor package structure 2a of FIG. 13. FIG. 15 illustrates a cross-sectional view taken along line 15-15 of FIG. 13. The semiconductor package structure 2a can be similar to the semiconductor package structure 2 as shown in FIGS. 11 and 12 in some respects, but can differ at least in that the substrate body 10 further includes an exposed area 30 on the second surface 102 thereof. The exposed area 30 may be left uncovered by the second encapsulant 24, and can be defined by the second surface 102 of the substrate body 10 and two inner surfaces 242 of the second encapsulant 24. The exposed area 30 can be defined by a notch in the second encapsulant 24.

The substrate body 10 can be cut from the substrate body 10 of the substrate structure 1a of FIGS. 3 to 5, and the exposed area 30 can be the non-molding area 15. However, the substrate body 10 may be cut from the substrate body 10 of the substrate structure 1b of FIGS. 6 and 7, and the exposed area 30 can be cut from the non-molding area 15a. In addition, the size of the first chip bonding area 16a can be different from the size of the second chip bonding area 18a. The exposed area 30 may be used for a chip, a passive element, a connector or a contact to be disposed thereon, or for external connection. Alternatively, the exposed area 30 may accommodate a corner portion or a protrusion portion of another element.

Figure 16:
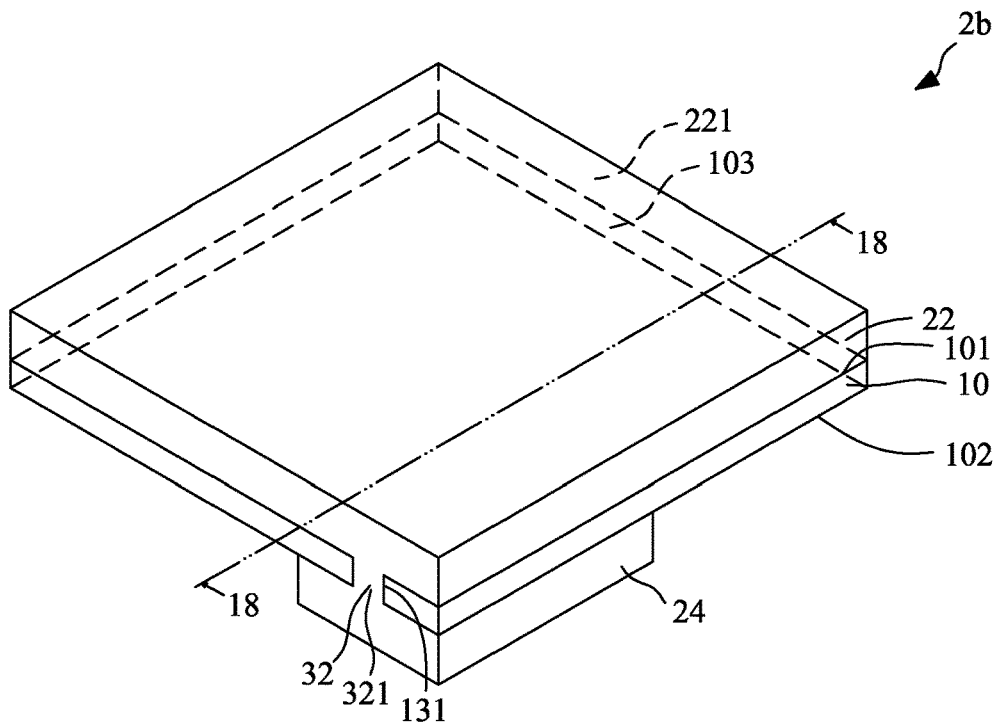
FIG. 16 illustrates a top perspective view of a semiconductor package structure according to one or more embodiments of the present disclosure.
Figure 17:
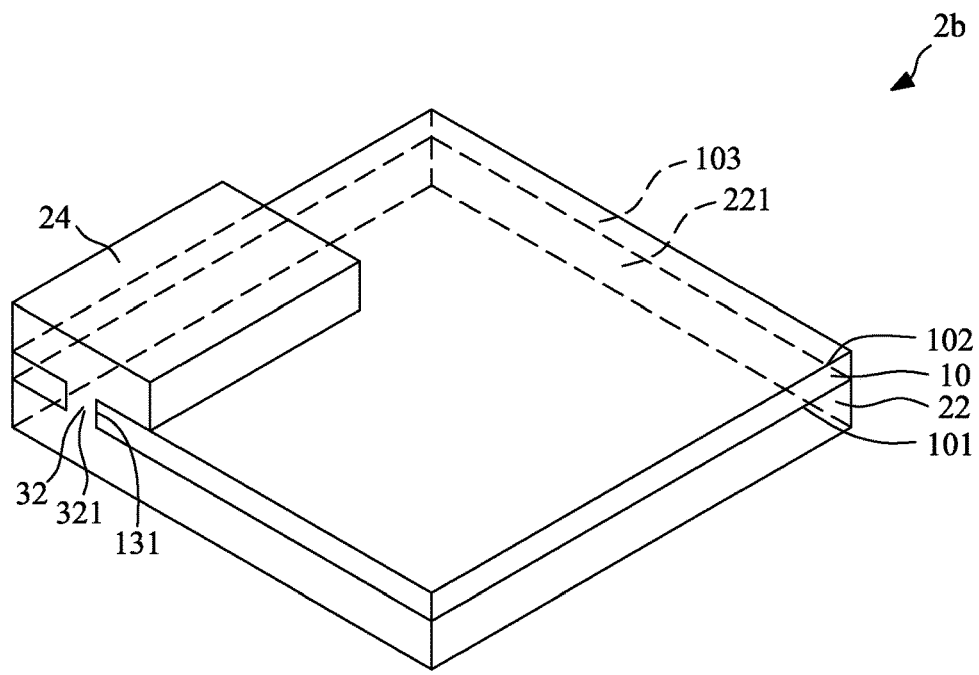
FIG. 17 illustrates a bottom perspective view of the semiconductor package structure of FIG. 16.
Figure 18:
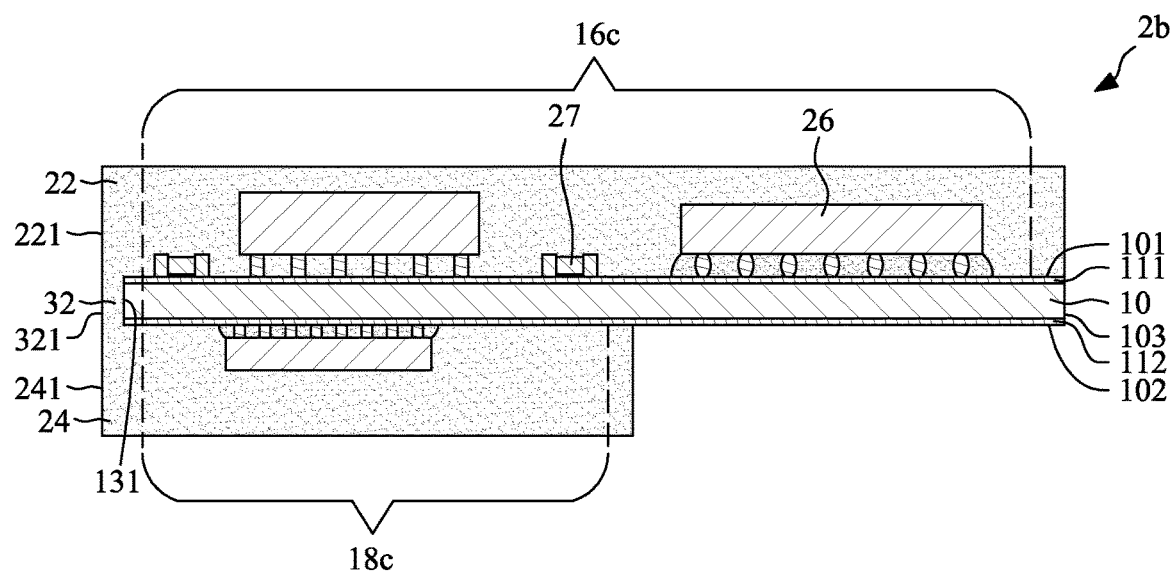
FIG. 18 illustrates a cross-sectional view taken along line 18-18 of FIG. 16.

FIG. 16 illustrates a top perspective view of a semiconductor package structure 2b according to one or more embodiments of the present disclosure. FIG. 17 illustrates a bottom perspective view of the semiconductor package structure 2b of FIG. 16. FIG. 18 illustrates a cross-sectional view taken along line 18-18 of FIG. 16. The semiconductor package structure 2b can be similar to the semiconductor package structure 2 as shown in FIGS. 11 and 12 in some respects, but can differ at least in the size of the second encapsulant 24. The substrate body 10 can be cut from the substrate body 10 of the substrate structure 1c of FIGS. 8 to 10. As shown in FIGS. 16, 17 and 18, the substrate body 10 can define about a half of the first through hole 131 extending through the substrate body 10, and the first through hole 131 can be exposed from the side surface 103 of the substrate body 10, (e.g., the first through hole 131 can have an opening positioned on the side surface 103). The size of the first encapsulant 22 can be different from the size of the second encapsulant 24. In the one or more embodiments illustrated in FIGS. 16, 17 and 18, the size of the first encapsulant 22 can be substantially equal to the size of the substrate body 10 and can be greater than, for example, at least about two times, at least about three times or at least about four times of the size of the second encapsulant 24, so that a large portion of the second surface 102 is exposed. In other embodiments, the size of the second encapsulant 24 is substantially equal to the size of the substrate body 10 and is greater than, for example, at least about two times, at least about three times or at least about four times of the size of the first encapsulant 22, so that a large portion of the first surface 101 is exposed.

The semiconductor package structure 2b can further include a third encapsulant 32 disposed in the first through hole 131. The third encapsulant 32 connects the first encapsulant 22 and the second encapsulant 24, and the third encapsulant 32, the first encapsulant 22 and the second encapsulant 24 can be formed integrally. Thus, there can be no boundary between the third encapsulant 32, the first encapsulant 22 and the second encapsulant 24. The third encapsulant 32 can have a side surface 321, and the side surfaces 103, 221, 241, 321 of the substrate body 10, the first encapsulant 22, the second encapsulant 24 and the third encapsulant 32 can be substantially coplanar. In some embodiments, the first through hole 131 and the third encapsulant 32 exposed from the side surface 103 of the substrate body 10 may be used as an orientation mark for the placement of the semiconductor package structure 2b.

Figure 19:
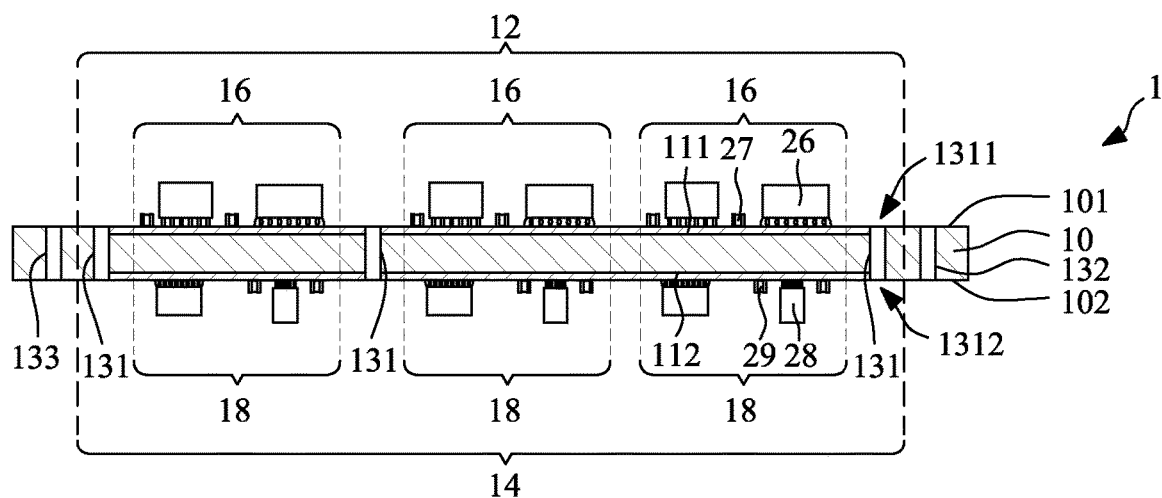
FIG. 19, FIG. 20, FIG. 21, FIG. 22 and FIG. 23 illustrate a packaging method according to one or more embodiments of the present disclosure.

FIGS. 19-23 illustrate a packaging method according to one or more embodiments of the present disclosure. Referring to FIG. 19, a substrate structure 1 is provided. In these embodiments, the substrate structure 1 can be similar to the substrate structure 1 illustrated in FIGS. 1 and 2, wherein the substrate structure 1 includes the substrate body 10, the first circuit layer 111, the second circuit layer 112, the first mold area 12, the second mold area 14, the first chip bonding areas 16 and the second chip bonding areas 18. The substrate body 10 can have a first surface 101 and a second surface 102 opposite to the first surface 101, and can define at least one first through hole 131 extending through the substrate body 10. The first circuit layer 111 can be disposed adjacent to the first surface 101 of the substrate body 10. The second circuit layer 112 can be disposed adjacent to the second surface 102 of the substrate body 10.

The first mold area 12 and the second mold area 14 can be designated areas which the encapsulant will cover in the following molding process. The first mold area 12 can be disposed on the first surface 101 of the substrate body 10, and the second mold area 14 can be disposed on the second surface 102 of the substrate body 10. In the one or more embodiments illustrated in FIGS. 19-23, the size of the first mold area 12 can be substantially equal to the size of the second mold area 14, and the position of the first mold area 12 can substantially correspond to the position of the second mold area 14. The first mold area 12 can be in communication with the second mold area 14 through the first through hole 131.

The first chip bonding area 16 can be disposed on the first surface 101 of the substrate body 10, wherein the first chip bonding area 16 and the first through hole 131 can be located within the first mold area 12, and the first through hole 131 can be located outside the first chip bonding area 16. The second chip bonding area 18 can be disposed on the second surface 102 of the substrate body 10, wherein the second chip bonding area 18 and the first through hole 131 can be located within the second mold area 14, and the first through hole 131 can be located outside the second chip bonding area 18.

The substrate structure 1 can further define at least one second through hole 132, at least one air venting through hole 133 and at least one position hole 134. In one or more embodiments, the substrate structure 1 can define a row of second through holes 132, a row of air venting through holes 133 and a row of position holes 134. The second through holes 132, the air venting through holes 133 and the position holes 134 can all extend through the substrate body 10. The second through holes 132 can be located outside the first mold area 12 and the second mold area 14. The air venting through holes 133 can be located outside the first mold area 12 and the second mold area 14. The position holes 134 can be located outside the first mold area 12 and the second mold area 14.

Then, the first chip 26 and the first passive element 27 can be bonded on the first chip bonding area 16 on the first surface 101 of the substrate body 10 so as to be electrically connected to the first circuit layer 111. The second chip 28 and the second passive element 29 can be bonded on the second chip bonding area 18 on the second surface 102 of the substrate body 10 so as to be electrically connected to the second circuit layer 112.

Figure 20:
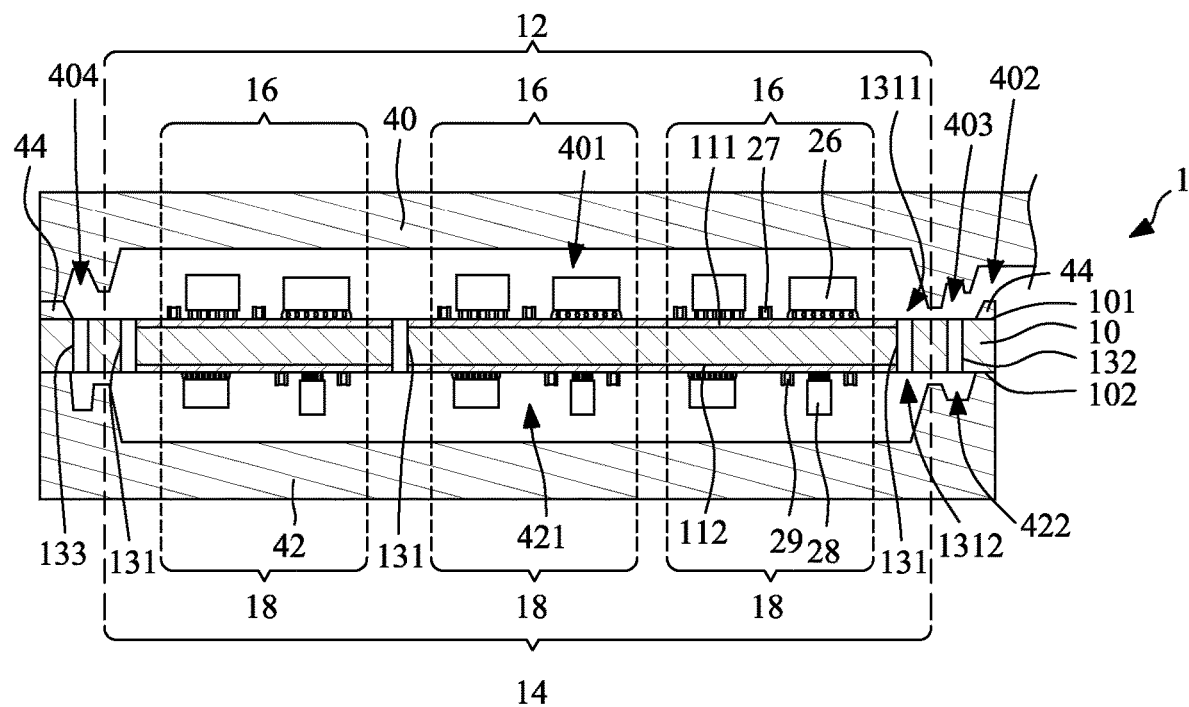

Referring to FIG. 20, a first mold chase 40, a second mold chase 42 and a clamp 44 can be provided. The substrate structure 1 can be sandwiched between the first mold chase 40 and the second mold chase 42. In the one or more depicted embodiments, the clamp 44 can be disposed on the first surface 101 of the substrate body 10 for clamping the substrate structure 1 on the second mold chase 42. However, in some embodiments, the clamp 44 may be omitted. The first mold chase 40 can define at least one first cavity 401 corresponding to the first mold area 12 of the substrate structure 1, and the second mold chase 42 can define at least one second cavity 421 corresponding to the second mold area 14 of the substrate structure 1. The first cavity 401 can be in communication with the second cavity 421 through the first through holes 131. In the one or more depicted embodiments, a size of the first cavity 401 is substantially equal to a size of the second cavity 421.

As shown in FIG. 20, the first mold chase 40 can further define an entrance cavity 402, at least one first recess portion 403 and at least one air venting channel 404. The first recess portion 403 can correspond to the second through hole 132 of the substrate structure 1, and can be in communication with the first cavity 401 and the entrance cavity 402. The second mold chase 42 can further define at least one second recess portion 422 corresponding to the second through hole 132 of the substrate structure 1 that is in communication with the second cavity 421.

It is noted that in some embodiments, when the first mold chase 40 and the second mold chase 42 clamp the substrate structure 1, a position pin of the first mold chase 40 or the second mold chase 42 can be inserted into the position holes 134 (FIG. 1) for positioning.

Figure 21:
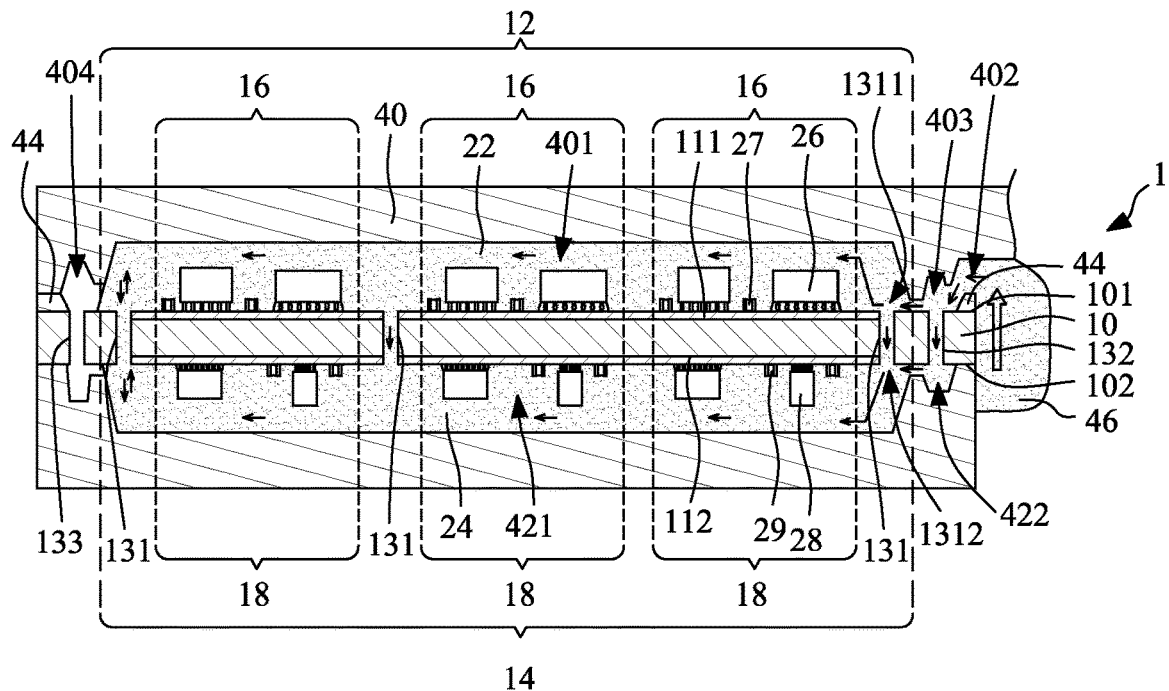

Referring to FIG. 21, a molding process can be performed. An encapsulant 46 can be applied to the first cavity 401 and the second cavity 421. A material of the encapsulant 46 may be a molding compound, such as fillers dispersed in a resin, which can be applied in a molten or fluid form. At the beginning of the molding process, the encapsulant 46 can be injected to the entrance cavity 402 of the first mold chase 40 above the first surface 101 of the substrate body 10. Then, the encapsulant 46 can enter the first recess portion 403, and can enter the second recess portion 422 through the second through holes 132, which can help to balance an amount of the encapsulant 46 on the first surface 101 of the substrate structure 10 and an amount of the encapsulant 46 on the second surface 102 of the substrate structure 10. Then, the encapsulant 46 can enter the first cavity 401 to cover the first mold area 12 and the first chip 26 and the first passive element 27 so as to form the first encapsulant 22. Meanwhile, the encapsulant 46 can further enter the second cavity 421 to cover the second mold area 14 through the first through hole 131 so as to form the second encapsulant 24. That is, the encapsulant 46 can flow through the first through holes 131, and each of the first through holes 131 can constitute a portion of a flow path of the encapsulant 46. Since the first through holes 131 can be used for the encapsulant 46 to flow through, a void caused by the flow of the encapsulant 46 can be reduced efficiently.

Figure 22:
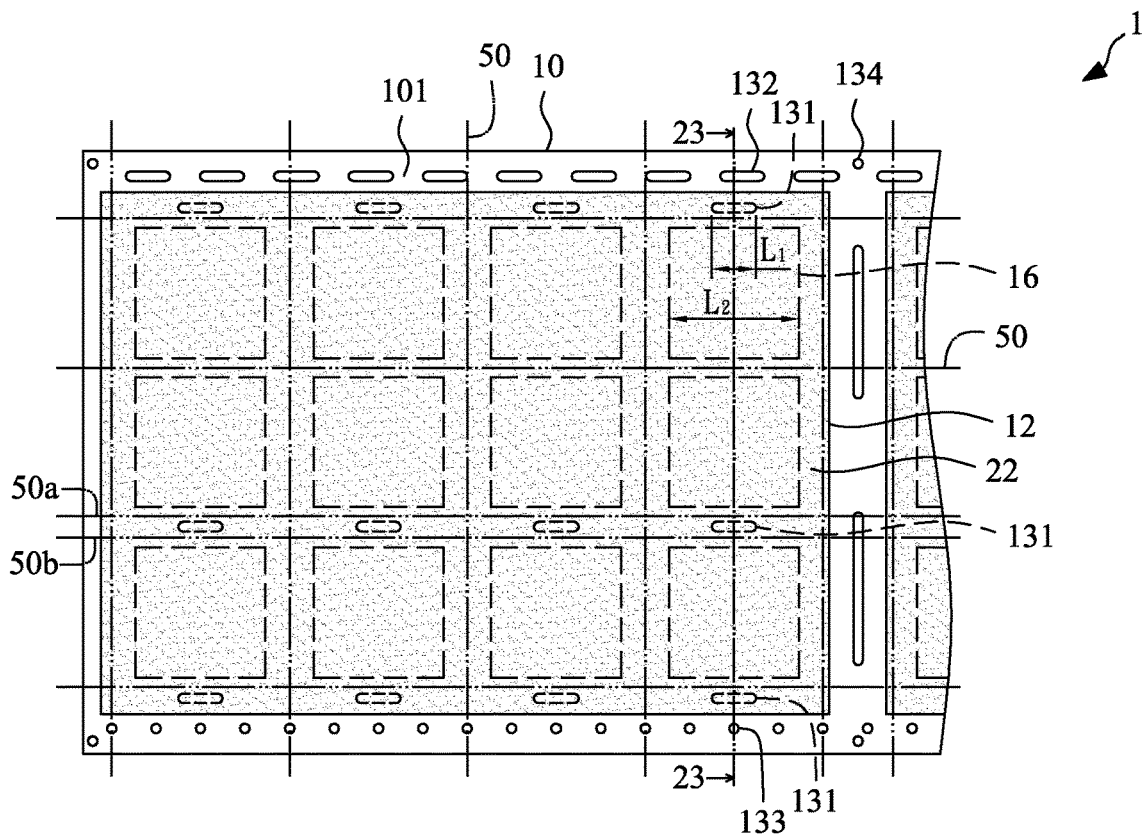
Figure 23:
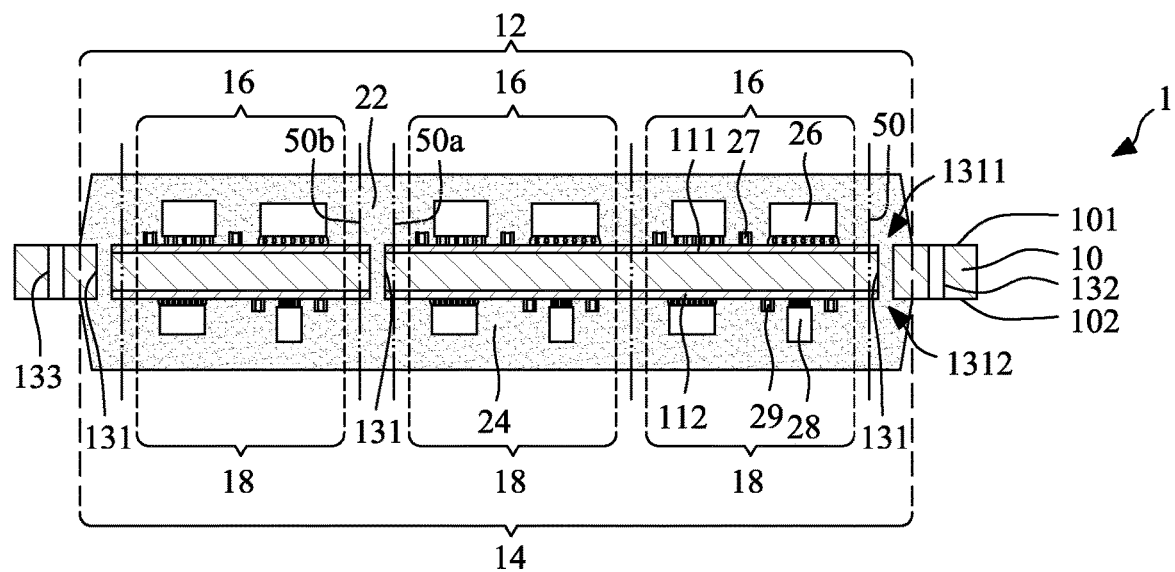

During the molding process, the air venting through holes 133 can be aligned with the air venting channels 404 of the first mold chase 40 so as to vent air in the first cavity 401 and the second cavity 421. Thus, deformation of the substrate structure 1 and a void caused by the flow of the encapsulant 46 can be reduced efficiently Referring to FIGS. 22 and 23, the first mold chase 40, the second mold chase 42 and the clamp 44 can be removed. FIG. 22 illustrates a top view of the substrate structure 1 with the encapsulant 46 according to one or more embodiments of the present disclosure. FIG. 23 illustrates a cross-sectional view taken along line 23-23 of the substrate structure 1 of FIG. 22. The first encapsulant 22 can cover a plurality of the first chip bonding areas 16 corresponding to the second chip bonding areas 18 covered by the second encapsulant 24. Then, the substrate structure 1 with the encapsulant 46 can be cut by, blade, for example, along the cutting lines 50. The cutting lines 50 can be disposed between the chip bonding areas 16, 18, and between the chip bonding areas 16, 18 and the first through holes 131, so as to obtain one or more semiconductor packages similar to the semiconductor package structure 2 illustrated in FIGS. 11 and 12. In the one or more embodiments illustrated in FIG. 22, the cutting lines 50 can include the cutting lines 50*a*, 50*b* to allow for removal of the second row of the first through holes 131. In such cases, the space between the second row of the chip bonding areas 16 and the third row of the chip bonding areas 16 can be cut twice. Alternatively, in situations such as those in which the width of the blade is greater than a gap between the cutting lines 50*a*, 50*b*, the space between the second row of the chip bonding areas 16 and the third row of the chip bonding areas 16 can be cut once.

In these one or more embodiments, during the molding process, the encapsulant 46 can be disposed on the first mold area 12, and can further enter the second mold area 14 through the first through holes 131. Then, the first encapsulant 22 on the first mold area 12 and the second encapsulant 24 on the second mold area 14 are cured at the same time. Therefore, a single instance of thermal processing can be conducted (although in some situations there may be reasons to conduct further thermal processing), and the substrate structure 1 will be less likely to deform during the curing process of a molding compound. Further, the manufacturing time is reduced, and the UPH is raised.

Figure 24:
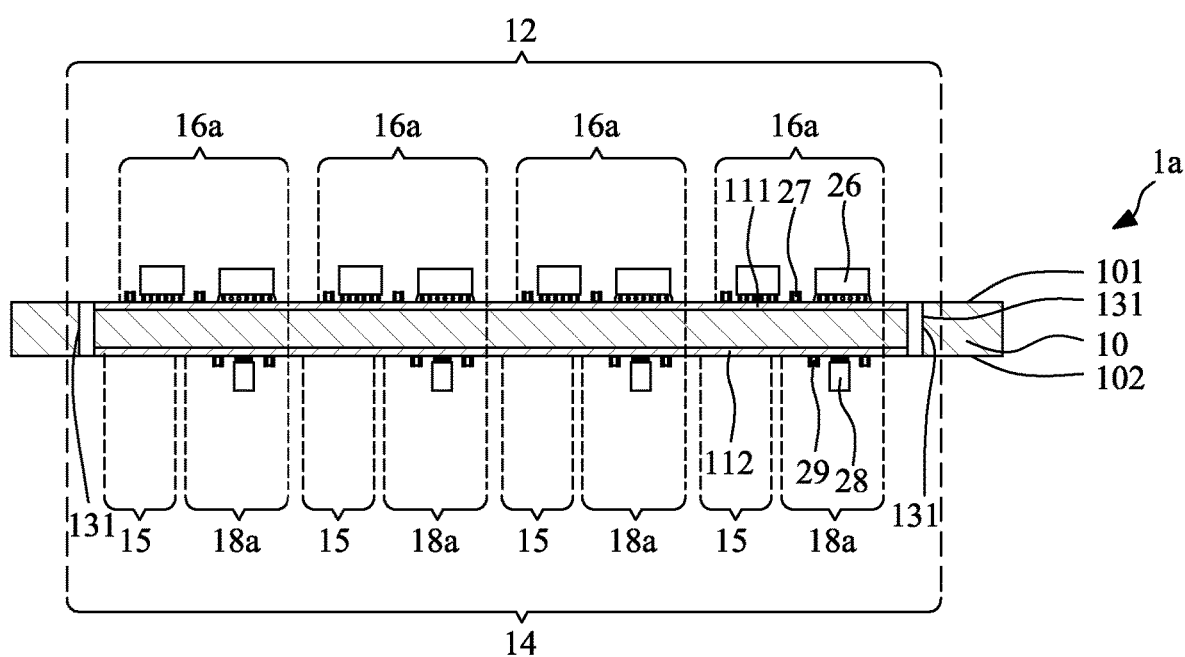
FIG. 24, FIG. 25, FIG. 26, FIG. 27, FIG. 28 and FIG. 29 illustrate a packaging method according to one or more embodiments of the present disclosure.

FIGS. 24-29 illustrate a packaging method according to one or more embodiments of the present disclosure. Referring to FIG. 24, a substrate structure 1*a* can be provided. In these one or more embodiments, the substrate structure 1*a* can be similar in some respects to the substrate structure 1*a* illustrated in FIGS. 3 to 5. The substrate structure 1*a* can be similar in some respects to the substrate structure 1 as shown in FIG. 19, but can differ at least in that the substrate structure 1*a* further includes a plurality of non-molding areas 15 in the second mold area 14. In addition, a size of the first chip bonding area 16*a* can be different from a size of the second chip bonding area 18*a*, and a position of the first chip bonding area 16*a* can correspond to a position of the second chip bonding area 18*a*. As shown in FIG. 24, each of the non-molding areas 15 can correspond to each of the second chip bonding areas 18*a*, and one non-molding area 15 and one second chip bonding area 18*a* together can correspond to one first chip bonding area 16*a*. It is understood that the substrate structure 1*a* may further define the second through holes 132, the air venting through holes 133 and the position holes 134 as shown in FIG. 19.

Then, the first chip 26 and the first passive element 27 can be bonded on the first chip bonding area 16*a* on the first surface 101 of the substrate body 10 so as to be electrically connected to the first circuit layer 111. The second chip 28 and the second passive element 29 can be bonded on the second chip bonding area 18*a* on the second surface 102 of the substrate body 10 so as to be electrically connected to the second circuit layer 112. In the one or more embodiments, there is no chip and passive element disposed on the non-molding areas 15. In another embodiment, one or more chips, one or more passive elements, one or more connectors or contacts may be disposed on the non-molding area 15.

Figure 25:
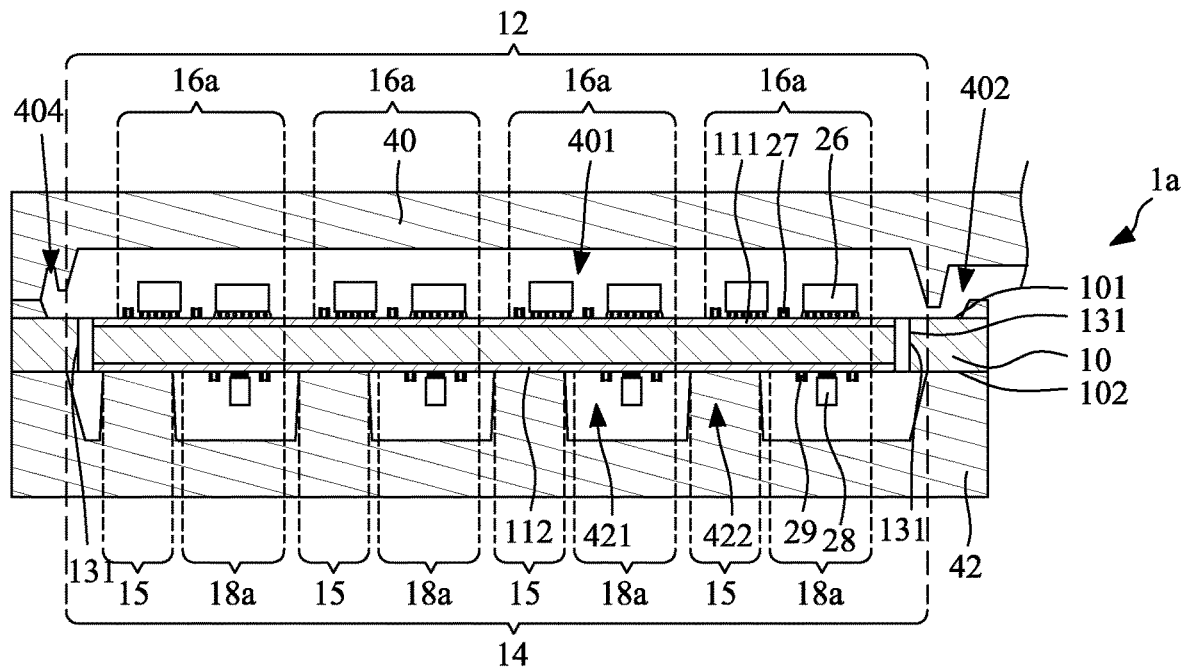

Referring to FIG. 25, the first mold chase 40, the second mold chase 42 and the clamp 44, which can be similar to the first mold chase 40, the second mold chase 42 and the clamp 44 as shown in FIG. 20, are provided. The substrate structure 1*a* can be sandwiched between the first mold chase 40 and the second mold chase 42. In these one or more embodiments, the size of the first cavity 401 can be different than the size of the second cavity 421 because, for example, the second mold chase 42 can further include a plurality of protrusion pins 422. Each of the protrusion pins 422 can contact each of the non-molding areas 15 so that the encapsulant 46 will not cover the non-molding areas 15 during the following molding process. It is noted that all positions in the second cavity 421 (except the protrusion pins 422) can be in communication with each other.

Figure 26:
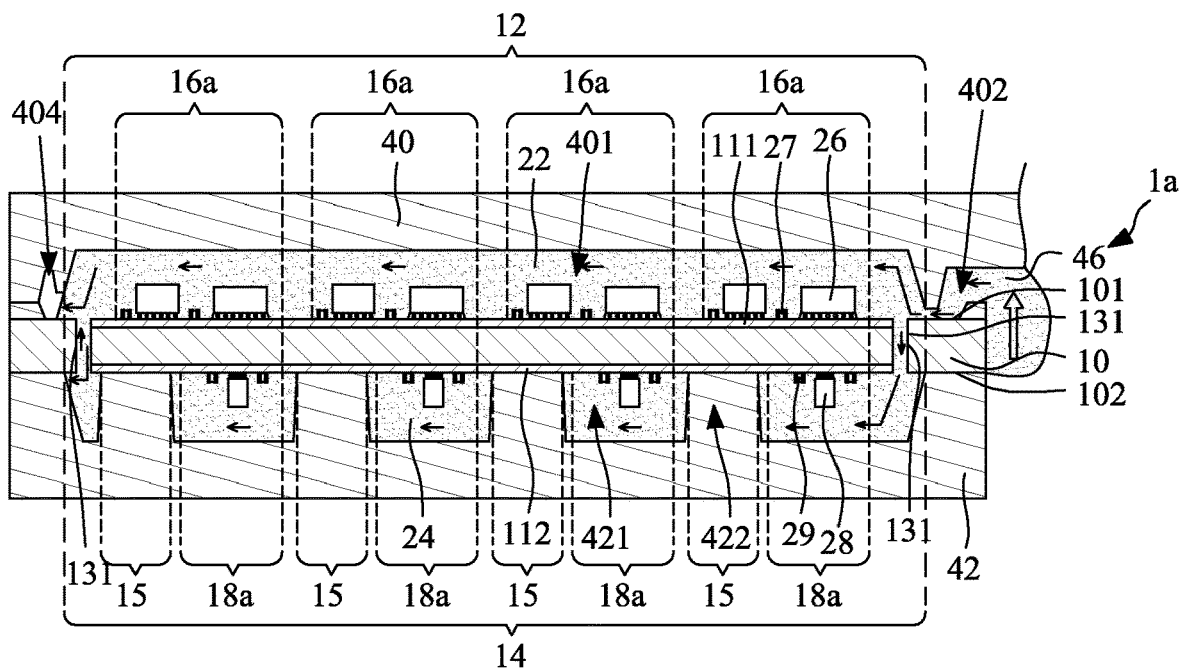

Referring to FIG. 26, a molding process can be performed. The encapsulant 46 can be applied to the first cavity 401 and the second cavity 421. The encapsulant 46 can enter the first cavity 401 to cover the first mold area 12 and the first chip 26 and the first passive element 27 so as to form the first encapsulant 22. Meanwhile, the encapsulant 46 can further enter the second cavity 421 to cover the second mold area 14 through the first through hole 131 so as to form the second encapsulant 24. It is noted that the encapsulant 46 does not cover the non-molding areas 15.

Figure 27:
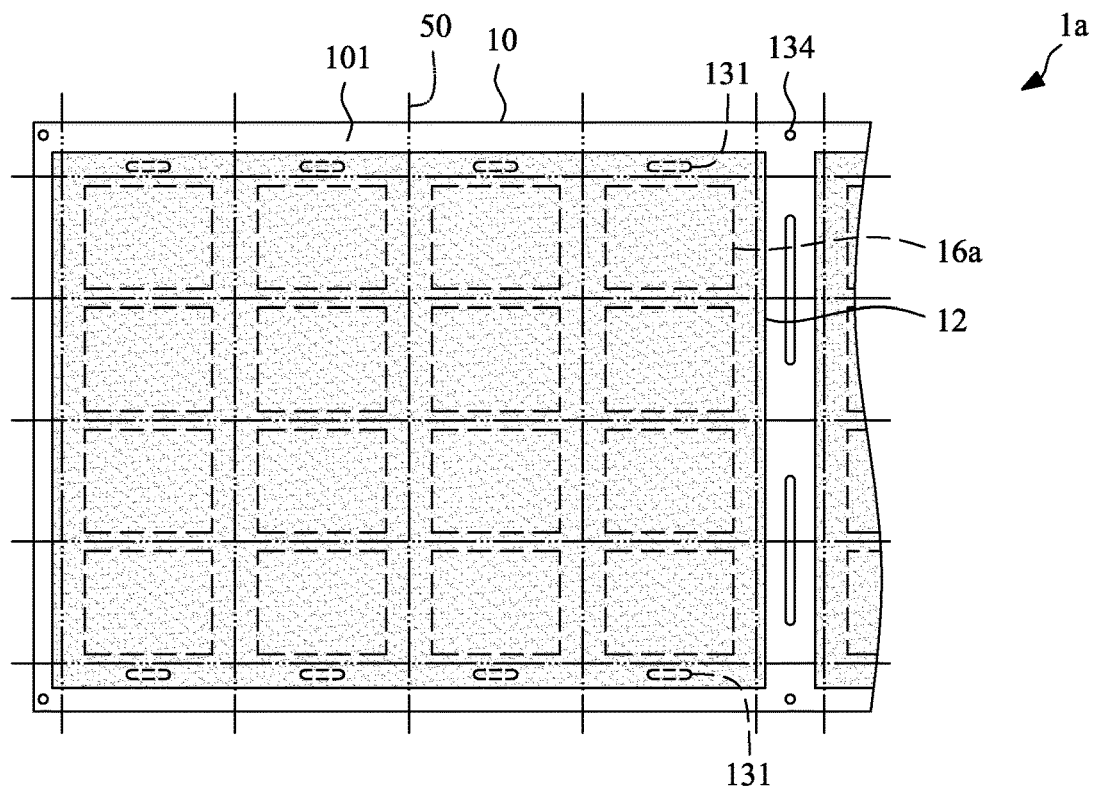
Figure 28:
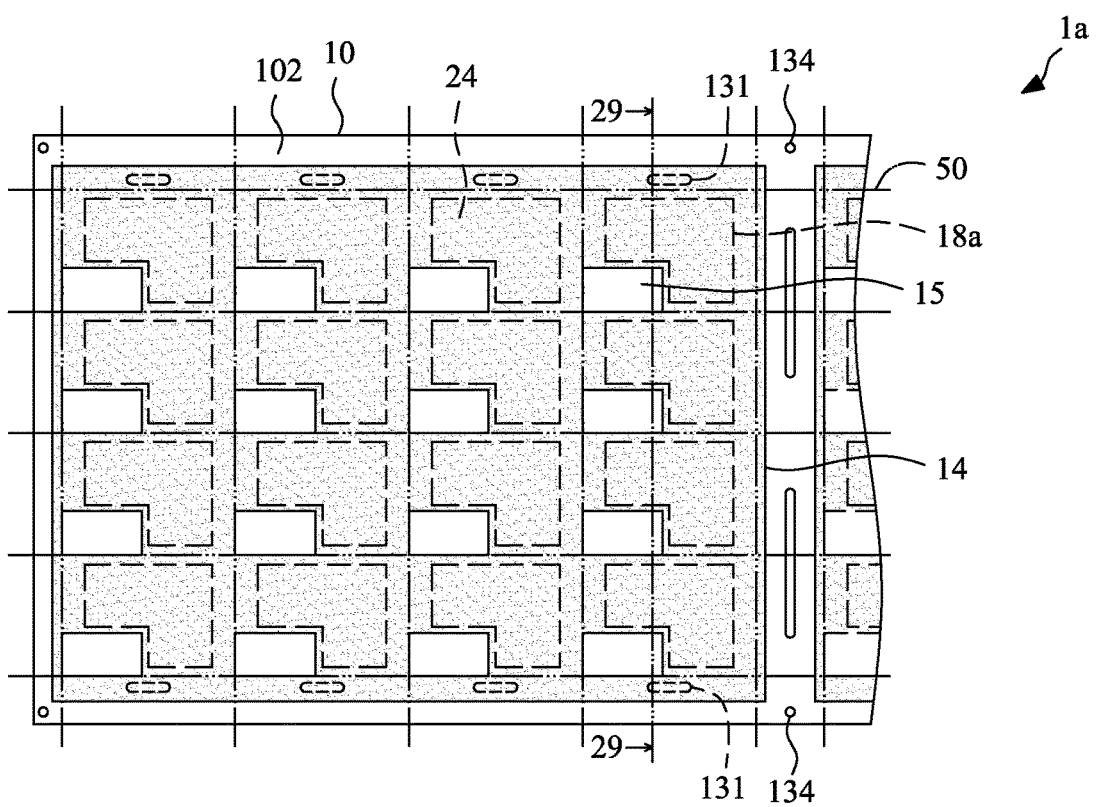
Figure 29:
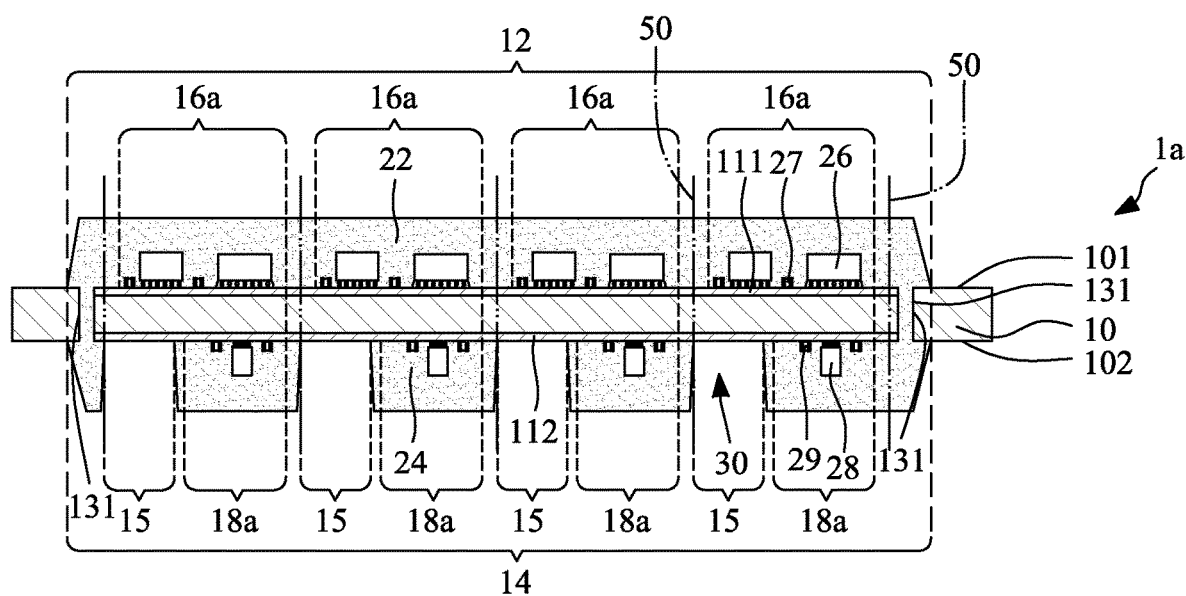

Referring to FIGS. 27 to 29, the first mold chase 40, the second mold chase 42 and the clamp 44 can be removed. FIG. 27 illustrates a top view of the substrate structure 1*a* with the encapsulant 46 according to one or more embodiments of the present disclosure. FIG. 28 illustrates a bottom view of the substrate structure 1*a* with the encapsulant 46 according to one or more embodiments of the present disclosure. FIG. 29 illustrates a cross-sectional view taken along line 29-29 of FIG. 28. The first encapsulant 22 can cover a plurality of the first chip bonding areas 16 corresponding to the second chip bonding areas 18 covered by the second encapsulant 24. The size of the first encapsulant 22 can be different from the size of the second encapsulant 24 because, for example, the second encapsulant 24 can further define a plurality of exposed areas 30 corresponding to the non-molding areas 15 to expose a plurality of portions of the second surface 102 of the substrate body 10. Then, the substrate structure 1*a* with the encapsulant 46 can be cut by, blade, for example, along the cutting lines 50. The cutting lines 50 can be disposed between the chip bonding areas 16*a*, 18*a*, and between the chip bonding areas 16*a*, 18*a* and the first through holes 131, so as to obtain one or more semiconductor package structures similar to the semiconductor package structure 2*a* illustrated in FIGS. 13 to 15.

Figure 30:
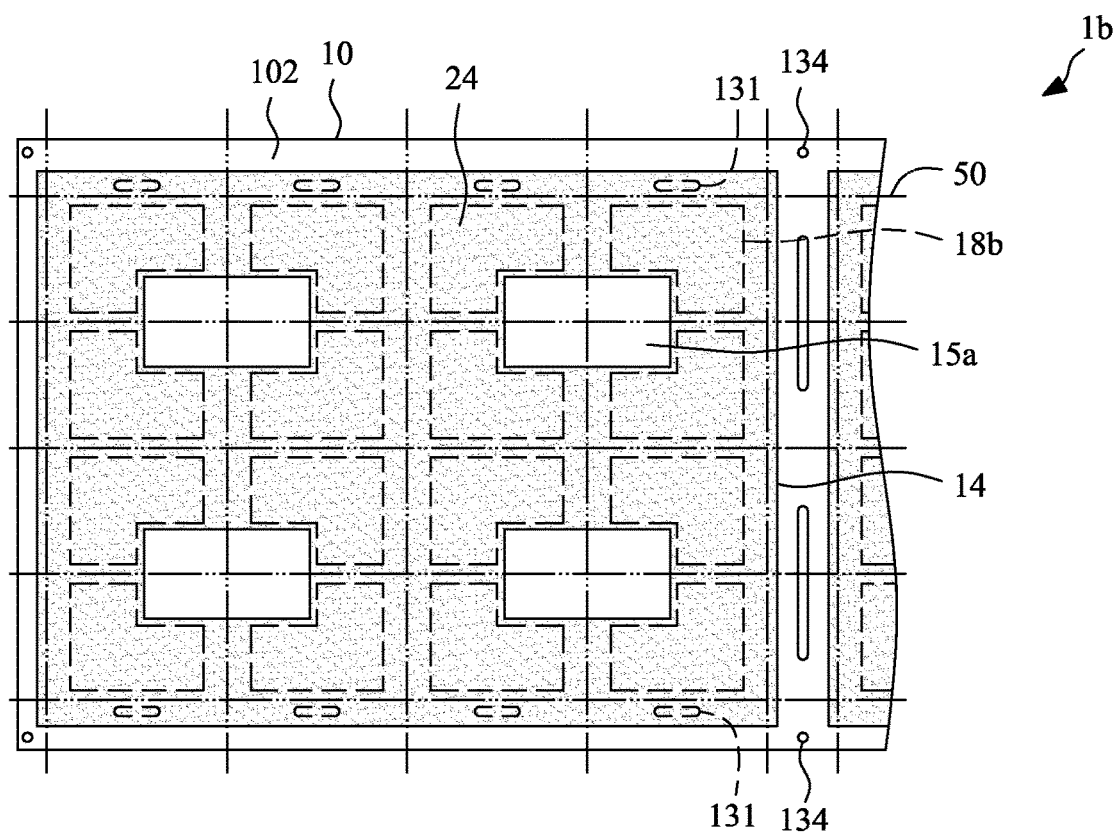
FIG. 30 illustrates a packaging method according to one or more embodiments of the present disclosure.

FIG. 30 illustrates a packaging method according to one or more embodiments of the present disclosure. The packaging method of this embodiment can be similar in some respects to the packaging method as shown in FIGS. 24 to 29, but can differ at least in that the substrate structure 1*b* (FIGS. 6 and 7) is used, wherein the size of the non-molding area 15*a* can be the sum of the sizes of four non-molding areas 15 (FIG. 4), and one non-molding area 15*a* can be surrounded by four second chip bonding areas 18*b*. In addition, two neighboring second chip bonding areas 18*b* can be in a relationship of mirror reflection to each other, as shown in FIG. 30. FIG. 30 illustrates a bottom view of the substrate structure 1*b* with an encapsulant according to one or more embodiments of the present disclosure. Then, the substrate structure 1*b* with the encapsulant can be cut by blade, for example, along the cutting lines 50. The resulting second encapsulant 24 can define a plurality of exposed areas corresponding to the non-molding areas 15 to expose a plurality of portions of the second surface 102 of the substrate body 10. Some of the cutting lines 50 can pass through the exposed areas (the non-molding areas 15), so as to obtain the semiconductor package structure 2*a* illustrated in FIGS. 13 to 15.

Figure 31:
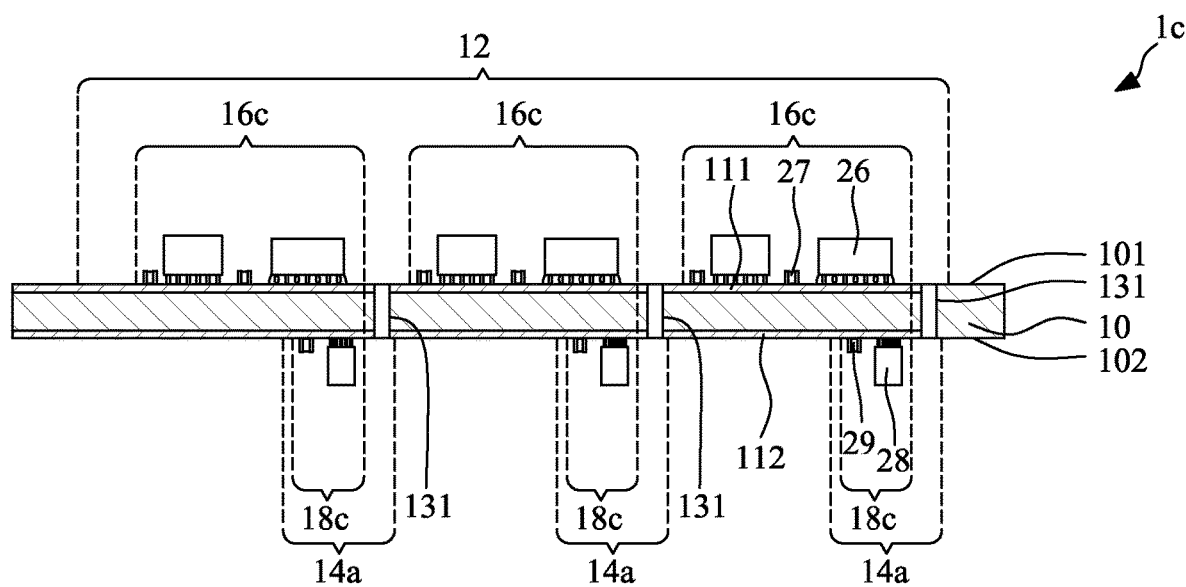
FIG. 31, FIG. 32, FIG. 33, FIG. 34, FIG. 35 and FIG. 36 illustrate a packaging method according to one or more embodiments of the present disclosure.

FIGS. 31-36 illustrate a packaging method according to one or more embodiments of the present disclosure. Referring to FIG. 31, a substrate structure 1*c* is provided. In these one or more embodiments, the substrate structure 1*c* can be the same as the substrate structure 1c illustrated in FIGS. 8 to 10. The substrate structure 1c is similar to the substrate structure 1 as shown in FIG. 19 in some respects, but can differ at least in the sizes and positions of the second mold areas 14a. The second mold areas 14a can be separated from each other, and each of the first through holes 131 can be located within a corresponding second mold area 14a. That is, each of the second mold areas 14a can be an individual mold area, and two neighboring second mold areas 14a can be spaced apart by a gap.

Each of the second chip bonding areas 18c can be located within a corresponding one of the second mold areas 14a. As shown in FIG. 31, one first mold area 12 can correspond to a plurality of second mold areas 14a and a plurality of first through holes 131, and all of the first through holes 131 can be in communication with the first mold area 12. It is understood that the substrate structure 1c may further define the second through holes 132, the air venting through holes 133 and the position holes 134 in a manner similar to that shown in FIG. 19.

Then, the first chip 26 and the first passive element 27 can be bonded on the first chip bonding area 16c on the first surface 101 of the substrate body 10 so as to be electrically connected to the first circuit layer 111. The second chip 28 and the second passive element 29 can be bonded on the second chip bonding area 18c on the second surface 102 of the substrate body 10 so as to be electrically connected to the second circuit layer 112. It is noted that a gap between the second mold areas 14a can be a non-molding area on which no chip or passive element is disposed.

Figure 32:
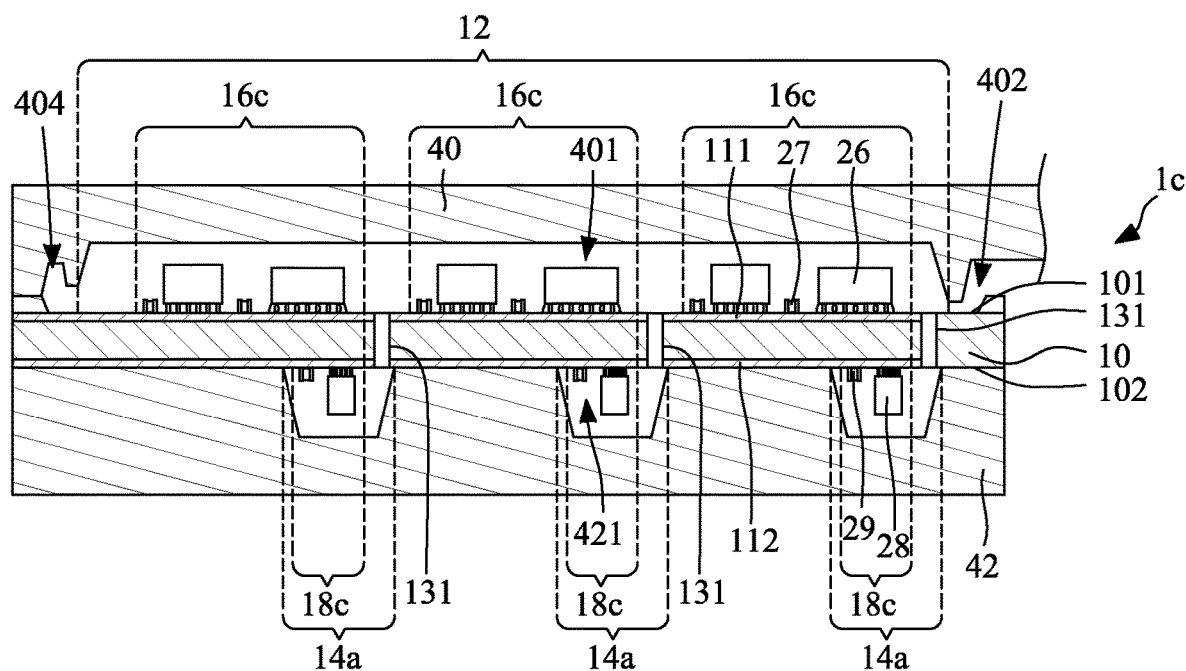

Referring to FIG. 32, the first mold chase 40, the second mold chase 42 and the clamp 44, which are similar to the first mold chase 40, the second mold chase 42 and the clamp 44 as shown in FIG. 19, can be provided. The substrate structure 1c can be sandwiched between the first mold chase 40 and the second mold chase 42. In these one or more embodiments, the second mold chase 42 can define a plurality of second cavities 421, and the size of the first cavity 401 corresponding to the first mold area 12 can be different than the size of the second cavity 421 corresponding to the second mold areas 14a. The second cavities 421 may, in some cases, not be in communication with each other, or may not be in direct communication with each other, and all of the second cavities 421 can be in communication with the first cavity 401 through the first through holes 131.

Figure 33:
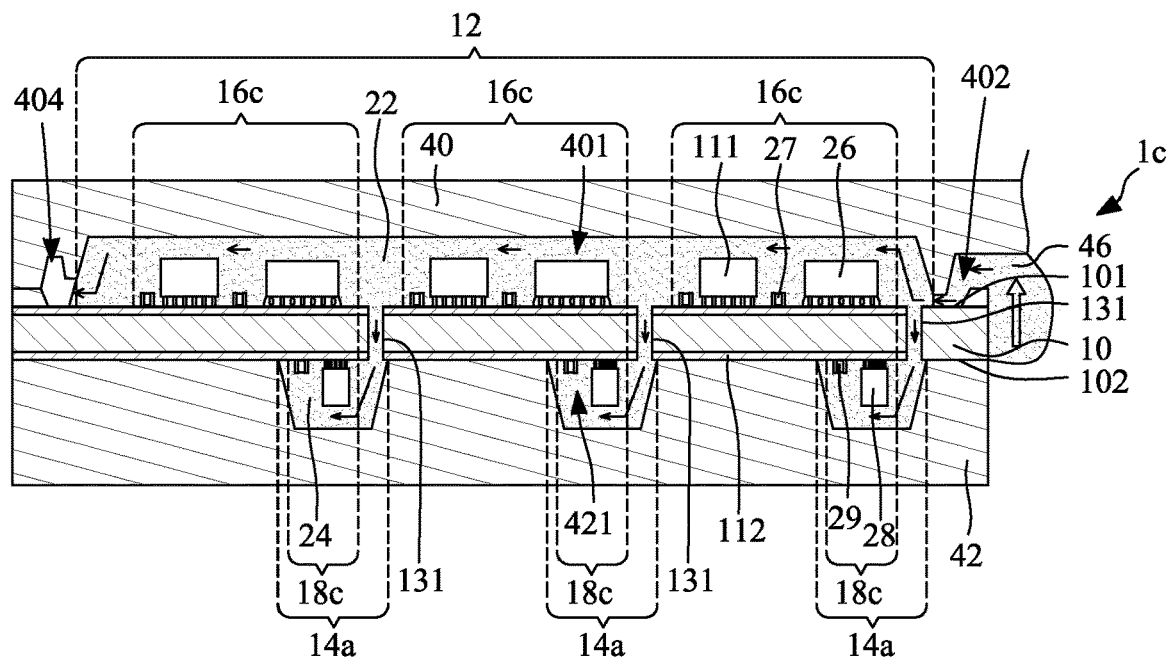

Referring to FIG. 33, a molding process can be performed. The encapsulant 46 can be applied to the first cavity 401 and to the second cavities 421. The encapsulant 46 can enter the first cavity 401 to cover the first mold area 12 and the first chip 26 and the first passive element 27 so as to form the first encapsulant 22. Meanwhile, the encapsulant 46 can further enter the second cavities 421 to cover the second mold area 14 through the first through holes 131 so as to form the second encapsulants 24. It is understood that the space between the second cavities 421 may not, in some cases, be covered by the encapsulant 46 in the molding process.

Figure 34:
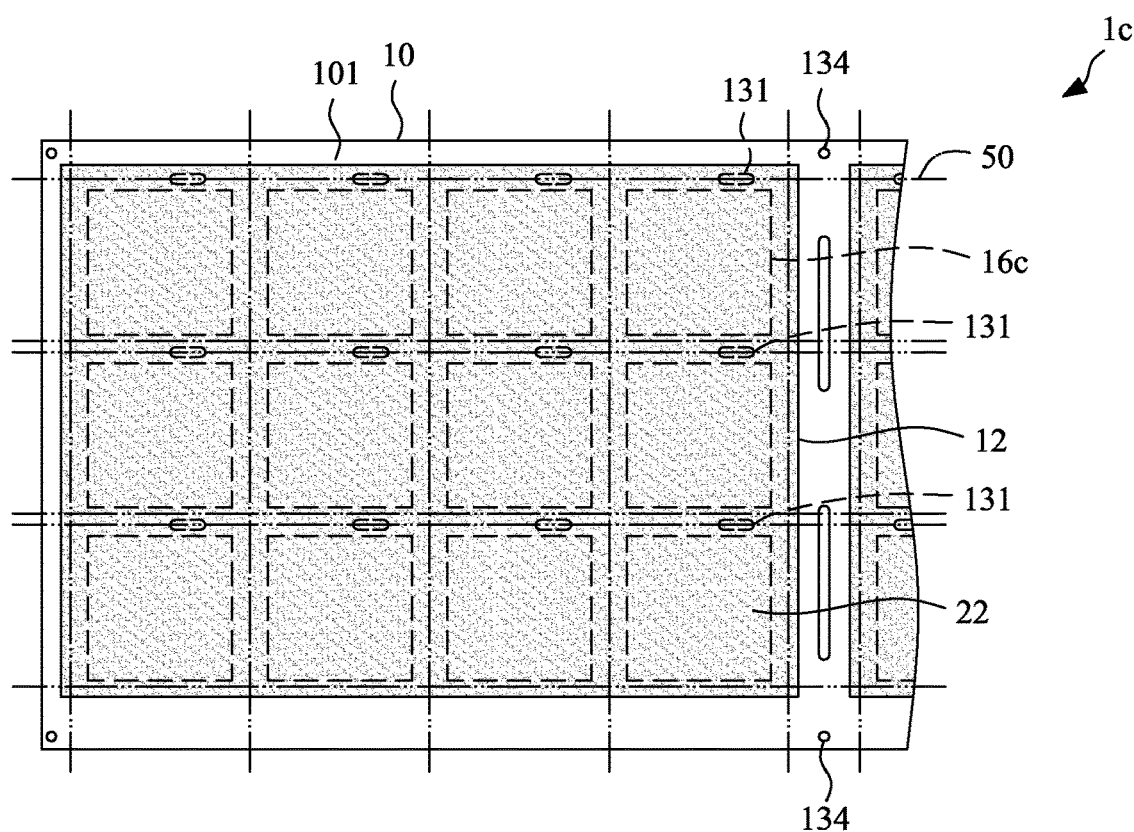
Figure 35:
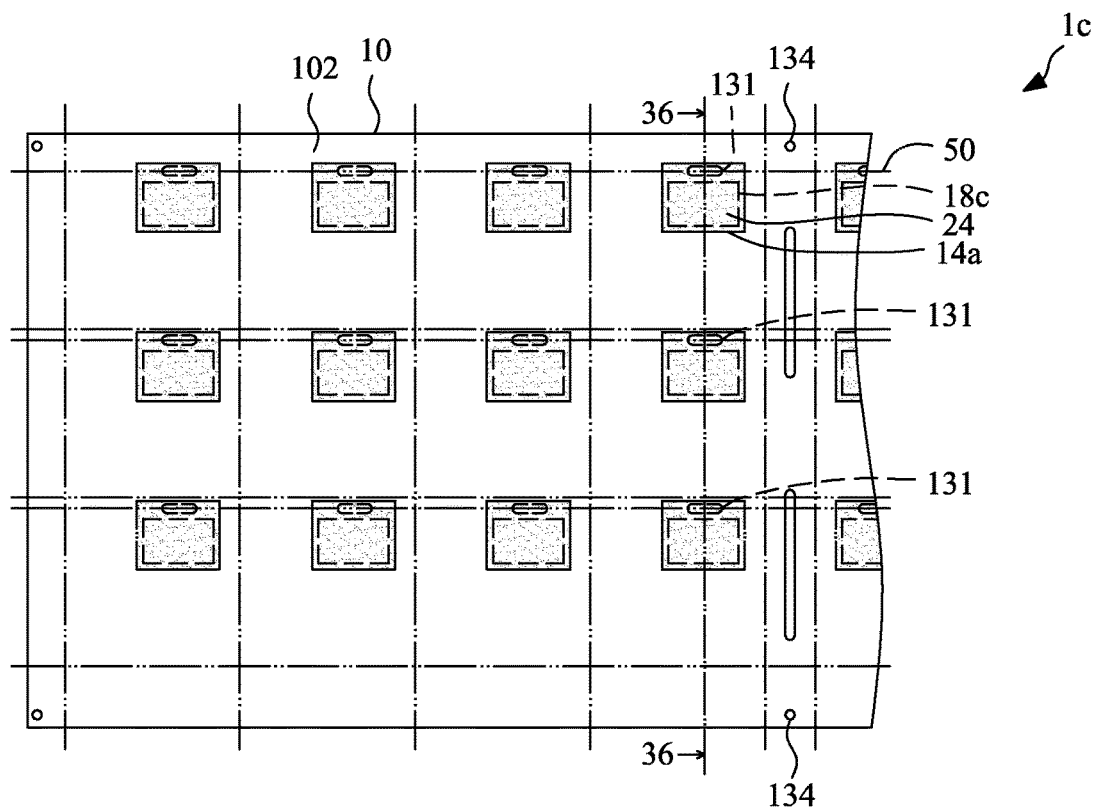
Figure 36:
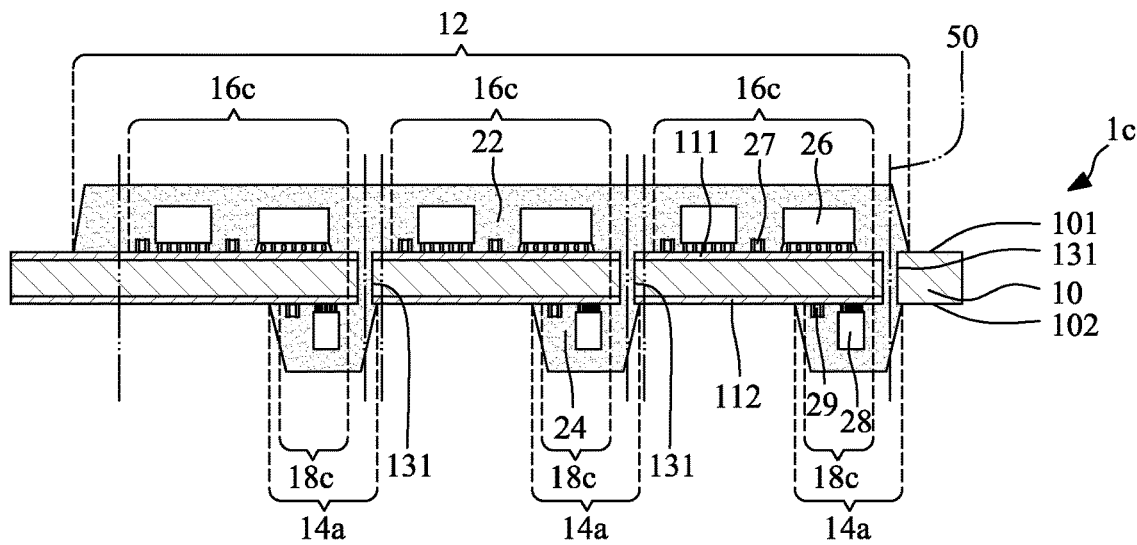

Referring to FIGS. 34 to 35, the first mold chase 40, the second mold chase 42 and the clamp 44 are removed. FIG. 34 illustrates a top view of the substrate structure 1c with the encapsulant 46 according to one or more embodiments of the present disclosure. FIG. 35 illustrates a bottom view of the substrate structure 1c with the encapsulant 46 according to one or more embodiments of the present disclosure. FIG. 36 illustrates a cross-sectional view taken along line 36-36 of FIG. 35. The first encapsulant 22 can cover a plurality of the first chip bonding areas 16c, and each of the second encapsulants 24 can cover each of the second chip bonding areas 18c. The size of the first encapsulant 22 can be different from the size of the second encapsulant 24. Then, the substrate structure 1c with the encapsulant 46 can be cut by, blade, for example, along the cutting lines 50. Some of the cutting lines 50 can pass through the first through holes 131, so as to obtain the semiconductor package structure 2b illustrated in FIGS. 16 to 18.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

In the description of some embodiments, a component provided "on" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
    a substrate body having a first surface, a second surface opposite to the first surface, a first area on the first surface and a second area on the second surface, and defining at least one first through hole communicating the first area with the second area, at least one second through hole located on a first side of the substrate body and is outside the first area and the second area, and at least one air venting hole located on a second side of the substrate body and is outside the first area and the second area, wherein the first side is opposite to the second side;
    a first circuit layer disposed adjacent to the first surface of the substrate body, wherein the first area is an area within an outer boundary of the first circuit layer; and
    a second circuit layer disposed adjacent to the second surface of the substrate body, wherein the second area is an area within an outer boundary of the second circuit layer, and a position outside the first area and the second area is outside of the outer boundaries of the first circuit layer and the second circuit layer.

2. The substrate structure according to claim 1, wherein the substrate body defines at least two rows of the first through holes.

3. The substrate structure according to claim 1, wherein the substrate body further defines at least one position hole extending through the substrate body, the position hole is located outside the first area and the second area, and is at a position adjacent to an edge of the substrate body.

4. The substrate structure according to claim 1, wherein the second circuit layer is electrically connected to the first circuit layer.

5. The substrate structure according to claim 1, further comprising a plurality of first chip bonding areas, wherein the first chip bonding areas and the first through hole are located within the first area, the first through hole is located outside the first chip bonding areas, and a length of the first through hole is in a range of one third to one half of a length of each of the first chip bonding areas.

6. The substrate structure according to claim 5, further comprising at least one second chip bonding area disposed on the second surface of the substrate body, wherein the second chip bonding area and the first through hole are located within the second area, and the first through hole is located outside the second chip bonding area.

7. The substrate structure according to claim 1, wherein the substrate body has an imaginary cutting line passing through the first through hole, the first through hole has a pair of longer sides and a pair of shorter sides, and the imaginary cutting line passes through the shorter sides of the first through hole.

8. The substrate structure according to claim 1, wherein the first through hole has a pair of longer sides and a pair of shorter sides, the second through hole has a pair of longer sides and a pair of shorter sides, and the longer sides of the first through hole are substantially parallel to the longer sides of the second through hole.

9. The substrate structure according to claim 1, wherein the substrate body defines a plurality of the first through holes arranged in at least one first row, and a plurality of the second through holes arranged in at least one second row, and an amount of the first through holes in the first row is less than an amount of the second through holes in the second row.

10. The substrate structure according to claim 1, wherein the substrate body defines a plurality of the first through holes arranged in a plurality of rows, a plurality of the second through holes arranged in a row, and a plurality of the air venting holes arranged in a row, the substrate body further comprises a plurality of chip boding areas arranged in a first row adjacent to the second through holes and a second row adjacent to the air venting holes, at least one of the rows of the first through holes are located between the row of the second through hole and the first row of the chip boding areas, and at least another one of the rows of the first through holes are located between the row of the air venting hole and the second rows of the chip boding areas.

11. The substrate structure according to claim 1, wherein the substrate body defines a plurality of the first through holes, and at least one of the first through holes is located adjacent to at least one side of each of the boding area.

12. A semiconductor package structure, comprising:
    a substrate body having a first surface and a second surface opposite to the first surface, and defining at least one first through hole extending through the substrate body, wherein the first through hole is exposed from a side surface of the substrate body, the substrate body includes an exposed area on the second surface;
    at least one first chip disposed on the first surface of the substrate body;
    at least one first encapsulant disposed on the first surface of the substrate body, and covering the first chip;
    at least one second chip disposed on the second surface of the substrate body;
    at least one second encapsulant disposed on the second surface of the substrate body, and covering the second chip, wherein the exposed area of the substrate body is defined by the second surface of the substrate body and two inner surfaces of the second encapsulant, and the two inner surfaces of the second encapsulant are non-parallel with each other; and
    at least one third encapsulant disposed in the first through hole, wherein the third encapsulant connects the first encapsulant and the second encapsulant.

13. The semiconductor package structure according to claim 12, wherein a size of the first encapsulant is different from a size of the second encapsulant such that a portion of the second surface is exposed.

14. The semiconductor package structure according to claim 13, wherein the exposed portion of the second surface is defined by a notch in the second encapsulant.

15. The semiconductor package structure according to claim 12, wherein the first encapsulant has a side surface, the second encapsulant has a side surface, the third encapsulant has a side surface, and the side surfaces of the substrate body, the first encapsulant, the second encapsulant and the third encapsulant are substantially coplanar.

16. The semiconductor package structure according to claim 12, wherein the substrate body has four side surfaces, the first encapsulant has four side surfaces, the second encapsulant has four side surfaces, and the four side surfaces of the substrate body, the four side surfaces of the first encapsulant and the four side surfaces of the second encapsulant are respectively substantially coplanar.

17. The semiconductor package structure according to claim 12, further comprising at least one first passive element disposed on the first surface of the substrate body and covered by the first encapsulant.

18. The semiconductor package structure according to claim 17, further comprising at least one second passive element disposed on the second surface of the substrate body and covered by the second encapsulant.

19. The semiconductor package structure according to claim 12, further comprising at least one first chip bonding area disposed on the first surface of the substrate body, wherein the first chip is disposed on the first chip boding area, the first through hole is located outside the first chip bonding area, the first through hole is a slot, and a length of the first through hole is in a range of one third to one half of a length of the first chip bonding area.

20. The semiconductor package structure according to claim 12, wherein the substrate body has a side surface, the first encapsulant has a side surface, the second encapsulant has a side surface, the third encapsulant has a side surface, and the side surfaces of the substrate body, the first encapsulant, the second encapsulant and the third encapsulant are substantially coplanar.

* * * * *